US008087979B2

(12) United States Patent
Rasmussen

(10) Patent No.: US 8,087,979 B2
(45) Date of Patent: Jan. 3, 2012

(54) RACK ENCLOSURE

(75) Inventor: Neil Rasmussen, Concord, MA (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 11/403,231

(22) Filed: Apr. 11, 2006

(65) Prior Publication Data

US 2006/0276121 A1    Dec. 7, 2006

Related U.S. Application Data

(63) Continuation of application No. 10/436,886, filed on May 13, 2003, now Pat. No. 7,033,267.

(51) Int. Cl.
*H05K 5/00* (2006.01)
*H05K 7/20* (2006.01)

(52) U.S. Cl. ........................... 454/184; 361/695

(58) Field of Classification Search .................. 454/184; 361/695
See application file for complete search history.

(56) References Cited

U.S. PATENT DOCUMENTS

| | | |
|---|---|---|
| 3,102,184 A | 8/1963 | Sherron |
| 4,352,274 A | 10/1982 | Anderson et al. |
| 4,774,631 A | 9/1988 | Okuyama et al. |
| 4,851,965 A | 7/1989 | Gabuzda et al. |
| 5,063,477 A | 11/1991 | Paggen et al. |
| 5,210,680 A | 5/1993 | Scheibler |
| 5,409,419 A | 4/1995 | Euchner et al. |
| 5,440,450 A | 8/1995 | Lau et al. |
| 5,497,288 A | 3/1996 | Otis et al. ........... 361/687 |
| 5,540,548 A | 7/1996 | Eberhardt et al. |
| 5,544,012 A * | 8/1996 | Koike ..................... 361/695 |
| 5,657,641 A | 8/1997 | Cunningham et al. |
| 5,718,628 A | 2/1998 | Nakazato et al. |
| 5,910,045 A | 6/1999 | Aoki et al. |
| 5,914,858 A | 6/1999 | McKeen et al. |
| 5,982,618 A | 11/1999 | Roos |

(Continued)

FOREIGN PATENT DOCUMENTS

DE  101 28 367    1/2003 ........................ 7/20

(Continued)

OTHER PUBLICATIONS

Liebert, "Foundation—60Hz", May 2002, 9 pages.

(Continued)

*Primary Examiner* — Steve McAllister
*Assistant Examiner* — Helena Kosanovic
(74) *Attorney, Agent, or Firm* — Lando & Anastasi, LLP

(57) ABSTRACT

An enclosure is provided for housing electronic equipment that accommodates the different cooling and ventilating requirements of different types of equipment. The enclosure is constructed and arranged to support cooling airflow in a front-to-back configuration through the enclosure and in a side-to-side configuration from one side to an opposite side of the enclosure. The enclosure can thereby provide within a single enclosure means cooling air for components using front-to-back airflow for cooling, such as information technology (IT) equipment, and for components using side-to-side airflow, such as certain types of telecommunications equipment. The enclosure can thereby support a mix of IT and telecommunications equipment, providing flexibility and adaptability in network room and data center configuration. The enclosure is further configured to separate intake air used by equipment for cooling from exhaust air vented by equipment into its interior during operation. As a result, the enclosure promotes sufficient equipment cooling and prevents/minimizes equipment overheating.

22 Claims, 25 Drawing Sheets

U.S. PATENT DOCUMENTS

| | | | |
|---|---|---|---|
| 5,999,403 | A | 12/1999 | Neustadt |
| 6,000,232 | A | 12/1999 | Witten-Hannah et al. |
| 6,052,282 | A | 4/2000 | Sugiyama et al. |
| 6,075,698 | A | 6/2000 | Hogan et al. |
| 6,101,459 | A | 8/2000 | Tavallaei et al. |
| 6,104,607 | A | 8/2000 | Behl |
| 6,145,502 | A | 11/2000 | Lyons et al. |
| 6,164,369 | A | 12/2000 | Stoller |
| 6,198,628 | B1 | 3/2001 | Smith |
| 6,222,729 | B1 | 4/2001 | Yoshikawa |
| 6,252,770 | B1 | 6/2001 | Yu et al. |
| 6,288,897 | B1 | 9/2001 | Fritschle et al. |
| 6,305,180 | B1 | 10/2001 | Miller et al. ............. 62/259.2 |
| 6,317,320 | B1 | 11/2001 | Cosley et al. |
| 6,368,064 | B1 | 4/2002 | Bendikas et al. |
| 6,375,561 | B1 | 4/2002 | Nicolai et al. ............. 454/184 |
| 6,406,257 | B1 | 6/2002 | Houdek |
| 6,412,292 | B2 | 7/2002 | Spinazzola et al. |
| 6,459,579 | B1 | 10/2002 | Farmer et al. ............. 361/695 |
| 6,462,944 | B1 | 10/2002 | Lin |
| 6,463,997 | B1 | 10/2002 | Nicolai et al. ............. 165/80.2 |
| 6,494,050 | B2 | 12/2002 | Spinazzola et al. |
| 6,535,382 | B2 | 3/2003 | Bishop et al. |
| 6,557,357 | B2 | 5/2003 | Spinazzola et al. |
| 6,565,428 | B2 | 5/2003 | Hsiao |
| 6,574,970 | B2 | 6/2003 | Spinazzola et al. |
| 6,611,428 | B1 | 8/2003 | Wong |
| 6,668,565 | B1 | 12/2003 | Johnson et al. |
| 6,682,159 | B2 | 1/2004 | Compagnucci |
| 6,704,196 | B1 | 3/2004 | Rodriguez et al. ............. 361/687 |
| 6,704,199 | B2 | 3/2004 | Wiley |
| 6,722,151 | B2 | 4/2004 | Spinazzola et al. |
| 6,724,624 | B1 | 4/2004 | Dodson |
| 6,745,579 | B2 | 6/2004 | Spinazzola et al. |
| 6,778,386 | B2 | 8/2004 | Garnett et al. |
| 6,788,535 | B2 | 9/2004 | Dodgen et al. ............. 361/695 |
| 6,819,560 | B2 | 11/2004 | Konshak et al. |
| 6,822,859 | B2 | 11/2004 | Coglitore et al. |
| 6,889,752 | B2 | 5/2005 | Stoller |
| 6,927,977 | B2 | 8/2005 | Singer |
| 7,033,267 | B2 | 4/2006 | Rasmussen |
| 7,112,131 | B2 | 9/2006 | Rasmussen et al. |
| 7,500,911 | B2 | 3/2009 | Johnson et al. |
| 2001/0029163 | A1 | 10/2001 | Spinazzola et al. |
| 2002/0007643 | A1 | 1/2002 | Spinazzola et al. |
| 2002/0059804 | A1 | 5/2002 | Spinazzola et al. |
| 2002/0095971 | A1 | 7/2002 | Pawson et al. |
| 2002/0108386 | A1 | 8/2002 | Spinazzola et al. |
| 2002/0121555 | A1 | 9/2002 | Cipolla et al. |
| 2003/0235035 | A1 | 12/2003 | Wintersteen et al. |
| 2004/0099747 | A1 | 5/2004 | Johnson et al. |
| 2004/0160720 | A1 | 8/2004 | Yamanashi et al. |
| 2004/0227435 | A1 | 11/2004 | Rasmussen |
| 2005/0048896 | A1 | 3/2005 | Shaben |
| 2005/0159098 | A1 | 7/2005 | Johnson et al. |
| 2005/0170770 | A1 | 8/2005 | Johnson et al. |
| 2007/0129000 | A1 | 6/2007 | Rasmussen et al. |
| 2007/0171613 | A1 | 7/2007 | McMahan et al. |
| 2009/0308579 | A1 | 12/2009 | Johnson et al. |

FOREIGN PATENT DOCUMENTS

| | | | |
|---|---|---|---|
| EP | 0 741 269 B1 | 11/2001 | |
| EP | 1 705 977 B1 | 9/2006 | |
| FR | 2193303 | 2/1974 | |
| FR | 2831019 | 4/2003 | .................. 7/20 |
| GB | 2 354 066 A | 3/2001 | |
| JP | 54-056503 | 4/1979 | |
| JP | 59-151478 | 8/1984 | |
| JP | 62-174397 | 11/1987 | |
| JP | 1-163541 | 6/1989 | |
| JP | 03-085797 | 4/1991 | |
| JP | 4-85785 | 7/1992 | |
| JP | 5-15423 | 1/1993 | |
| JP | 5-160592 | 6/1993 | |
| JP | 51-55922 | 6/1993 | |
| JP | 06-272694 | 9/1994 | |
| JP | 07-098781 | 4/1995 | |
| JP | 08-285421 | 1/1996 | |
| JP | 09-064555 | 7/1997 | |
| JP | 10-339500 | 12/1998 | |
| JP | 11-184570 | 9/1999 | |
| JP | 2000-047757 | 2/2000 | |
| JP | 2000-112574 | 4/2000 | |
| JP | 2000-315883 | 11/2000 | |
| JP | 2001-231673 | 8/2001 | |
| JP | 2001-257496 | 9/2001 | |
| WO | 01/62060 A1 | 8/2001 | |
| WO | 0186217 | 11/2001 | |
| WO | 0216854 | 2/2002 | |
| WO | 02093093 | 11/2002 | |
| WO | 2004049773 | 6/2004 | |

OTHER PUBLICATIONS

Liebert, "DataCool—60 Hz", May 2002 2 pages.
Partial International Search Report for PCT/US03/37625 mailed Jun. 1, 2004.
European Search Report for EP 08 16 4463 dated Mar. 1, 2010.
International Search Report mailed May 4, 2005.
Website: http://www.sharkrack.com/cart/display.php?category_id=16&product_is=25.
Website: http://www.edpeurope.com/sharkrack.html.
Enterprise 4000/4500/Stor Rack Kit Installation Instructions.
International Search Report for PCT/US2005/005148 mailed Jun. 17, 2006.

* cited by examiner

RACK ENCLOSURE

This application is a continuation application of U.S. application Ser. No. 10/436,886, filed on May 13, 2003 now U.S. Pat. No. 7,033,267, all of which are incorporated herein by reference.

FIELD OF THE INVENTION

The invention relates to an enclosure for use with rack-mounted equipment.

BACKGROUND OF INVENTION

Advancements in information technology (IT) equipment present challenges in creating a more effective IT environment in data centers and networking facilities. Equipment enclosures designed for high power density applications employing servers and networking equipment typically must provide not only effective cable management and power distribution, but also adequate cooling and ventilation to assure proper and reliable operation of equipment. Equipment rack enclosures for use in such high heat generating applications are primarily configured and equipped to provide front-to-back airflow to accommodate the standard front-to-back airflow pattern used by IT equipment for cooling and ventilation. However, IT equipment racks and enclosures generally cannot provide adequate cooling and ventilation for equipment that typically uses a side-to-side airflow, such as certain types of telecommunications equipment. When an IT equipment enclosure includes equipment using side-to-side airflow and equipment using front-to-back airflow, the air intakes of the side-to-side equipment typically share the enclosure interior with the exhaust vents of all of the equipment. As a result, the air intakes of equipment using side-to-side airflow often do not receive sufficient cooling air required for proper operation of the equipment. Insufficient cooling air can cause overtemperature shutdown and unreliable performance and reduced lifetime of the equipment. IT equipment enclosures and racks configured to provide front-to-back airflow, therefore, are essentially incompatible with airflow patterns of some types of electronic equipment using side-to-side airflow for cooling and ventilating, such as certain types of telecommunications components.

Conventional solutions to this problem include mounting, for example, telecommunications equipment in open-frame racks to promote air circulation through components. Open-frame configurations do not confine hot and warm exhaust air within an enclosure or around equipment air intakes; however, such configurations do not prevent circulation of exhaust air to equipment air intakes and, therefore, do not overcome problems of insufficient cooling and overheating of equipment. Telecommunications equipment disposed in side-by-side rack configurations are susceptible to direct intake of exhaust air vented from adjacent or neighboring equipment and, as a result, have an increased risk of overheating during operation.

Another solution includes incorporating fans in a top of a housing of an enclosure to draw hot and warm air vertically upward from within a rack to vent exhaust air through the enclosure top. Such top-mounted fans, however, do not assure sufficient cooling air will be provided to air intakes of all equipments components mounted in a rack. Nor do top-mounted fans prevent exhaust air from circulating to air intakes of such components. Top-mounted fans can further overdrive airflow through a rack and can cause significant mixing of exhaust air with cooling air. Mixing exhaust air with cooling air can reduce the efficiency of a network room or data center's cooling system. Using top-mounted fans limits the space available on an enclosure top for other functions, including data and power cabling. In addition, top-mounted fans restrict the size and location of equipment that can be mounted in upper sections of the enclosure due to interference with fan airflow.

Further, the overall efficiency, cost, reliability and cooling capacity of a cooling system of a network room or data center is directly related to the ability to separate cooling air from hot and warm exhaust air within an equipment enclosure during operation of equipment. Separation of exhaust air from cooling air is a result of proper installation of rack enclosures; however, present enclosure and rack designs and cooling solutions for electronic equipment using side-by-side airflow do not separate exhaust air from cooling air. In the past, circulation of exhaust air with cooling air was not problematic because the power density of equipment, for instance, telecommunications equipment was significantly less than an average of 1 kW per rack. Current designs of telecommunications equipment, however, may consume 6 kW or more per rack, and, thus, require effective cooling methods.

SUMMARY OF THE INVENTION

In general, in an aspect, the invention provides an improved enclosure means for electronic equipment that accommodates cooling and ventilating requirements of different types of equipment. In one aspect, the invention provides an enclosure means configured to separate cooling intake air from exhaust air vented by equipment during operation to facilitate sufficient cooling and to prevent overheating of the equipment. In another aspect, the invention provides an enclosure means configured to separate cooling intake air from exhaust air vented by equipment using side-to-side airflow for cooling and ventilating. Another aspect of the invention provides an enclosure configured to simultaneously accommodate different cooling requirements of different types of rack-mounted equipment using front-to-back airflow or side-to-side airflow within the same enclosure, while separating cooling intake air from exhaust air. A further aspect of the invention provides an enclosure having an interior defining a plenum or chamber constructed and arranged to receive and to contain cooling air for intake by equipment using side-to-side airflow for cooling. In another aspect, a chamber or plenum can be configured within an equipment enclosure wherein the chamber or plenum is constructed and arranged to contain cooling air for intake by equipment using side-to-side airflow and to prevent air loss from the chamber or plenum. Yet another aspect of the invention provides an enclosure having an adaptable configuration to meet different airflow requirements of equipment using front-to-back airflow and equipment using side-by-side airflow for cooling and ventilating. Still a further aspect of the invention provides a system of barriers, partitions, interconnections and other components to permit an interior of an enclosure, and/or an equipment rack housed within the enclosure, to be easily and rapidly configured and arranged for mounting different types of equipment and for simultaneously supporting different airflow patterns used by the equipment for cooling and ventilating.

In general, in one aspect, the invention provides an enclosure for containing equipment comprising a housing including a top side, a bottom side, a first side, a second side, and a front side, at least one of the bottom side and the front side having formed therein at least one opening to receive cooling air into a front portion of an interior of the housing, and at least one of the rear side and the top side having formed therein at least one opening to allow exhaust air to vent from within a back portion of the interior of the housing to an area external to the housing; an internal frame disposed in the interior of the housing and spaced from the first side and the second side and secured therein to allow mounting of one or more equipment components in an equipment area formed by the internal frame; and a first air plenum disposed along a first side of the internal frame between the internal frame and the first side of the housing, the first air plenum being in fluid communication with the front portion of the interior of the housing to receive cooling air from the openings and being configured to contain air along the first side of the internal frame such that air can flow from the first air plenum into equipment in the internal frame.

Implementations of the invention may include one or more of the following features. The enclosure further comprises a second air plenum disposed along a second side of the internal frame between the internal frame and the second side of the housing, the second air plenum being in fluid communication with the back portion of the interior of the housing and adapted to receive exhaust air from equipment in the internal frame. The first air plenum includes a back section that provides an airflow blocking barrier between the first air plenum and the back portion of the interior of the housing. The second air plenum includes a front section that provides an airflow blocking barrier between the second air plenum and the front portion of the interior of the housing.

The enclosure further comprises a first partition removably mounted between the first air plenum and the first side of the internal frame to block air flow from the first air plenum into a portion of the equipment area of the internal frame. In addition, the enclosure further comprises a second partition removably mounted between the second air plenum and the second side of the internal frame to block air flow from a portion of the equipment area of the internal frame into the second air plenum. The enclosure further comprises an exhaust unit coupled to at least one of the rear panel and the top panel, the exhaust unit having at least one fan contained to draw air from within the interior of the enclosure.

The enclosure further comprises a first partition removably mounted between the first air plenum and the first side of the internal frame to block air flow from the first air plenum into a portion of the equipment area of the internal frame. The front portion is adapted to provide cooling air to equipment mounted to the internal frame, wherein the equipment is adapted for front to back cooling.

In another aspect, the invention provides a method of cooling a first device and a second device, each of which is mounted in an equipment enclosure, wherein the first device is configured for front to back cooling, and the second device is configured for side to side cooling, the method comprising receiving cooling air into an internal front portion of the equipment enclosure; drawing air from the internal front portion through the first device into a rear internal portion of the enclosure; drawing air from the internal front portion to a side internal portion of the enclosure; drawing air from the side internal portion through the second device and into a second side internal portion; exhausting air from the second side internal portion and from the rear internal portion out of at least one of a top of the enclosure and a back of the enclosure; and separating air exhausted from devices from air to be drawn into devices. The enclosure includes an equipment frame having an internal area that contains the first device and the second device, and wherein the method further includes removably mounting a first partition between the side internal portion and the internal area of the equipment frame to block air flow between the side internal portion and a portion of the internal area.

The method further comprises inserting a third device into the equipment frame, the third device being configured for side to side cooling; and removing the first partition to allow side to side airflow through the third device.

In a further aspect the invention provides an equipment enclosure for containing equipment comprising an external housing; an internal frame disposed in the interior of the housing and secured within the housing to allow mounting of equipment components in an equipment area formed by the internal frame, the equipment components including a first type of equipment having front to back cooling and a second type of equipment having side to side cooling; and means for facilitating air flow from a front internal portion of the external housing to a back internal portion of the external housing, such that when equipment of the first type is mounted in the internal frame, side to side cooling can be achieved and when equipment of the second type is mounted in the internal frame front to back cooling can be achieved.

In yet another aspect, the invention provides an equipment enclosure comprising a 23-inch enclosure housing having a front side, a first side, a second side and a back side; a 19-inch wide equipment frame disposed within the internal area of the enclosure housing, such that a first side area is formed between the first side of the enclosure housing and a first side of the equipment frame, a second side area is formed between a second side of the equipment frame and the second side of the enclosure housing, a front area is formed between the front side of the enclosure housing and a front side of the equipment frame, and a back area is formed between the back side of the enclosure housing and a back side of the equipment frame; a first internal panel disposed between the first side of the equipment frame and the first side of the enclosure housing to provide a substantially air tight seal between the first side area and the back area; and a second internal panel disposed between the second side of the equipment frame and the second side of the enclosure housing to provide a substantially air tight seal between the second side area and the front area. The enclosure includes a top side and a bottom side, and wherein at least one of the front side and the bottom side include openings to allow air flow into the enclosure, and at least one of the top side and the back side include openings to allow air flow out of the enclosure.

The enclosure further comprises at least one exhaust fan mounted to one of the top side of the enclosure and the back side of the enclosure to draw air from the back area.

Various aspects of the invention may provide one or more of the following advantages. A single type of equipment enclosure can be used to contain electronic equipment regardless of an airflow pattern, e.g., front-to-back airflow or side-to-side airflow, used by the equipment to meet its cooling and ventilating needs. The enclosure can thereby help to simplify the planning, design and maintenance of a data center or network room. Equipment components using side-to-side airflow can be mounted in a rack housed within an enclosure having one or more doors, e.g., as an alternative to an open-frame rack, to provide enhanced security and protection of the equipment.

An enclosure, and/or a rack housed within the enclosure, configured to permit front-to-back airflow can be converted, e.g., easily and rapidly reconfigured, to accommodate the operating requirements of equipment using side-to-side airflow for cooling and ventilating. The enclosure interior can be configured to define an air intake chamber or plenum along a side, e.g., left side, of the rack that is substantially enclosed and can receive and contain cooling air from which equipment using side-to-side airflow may draw from to meet its cooling and ventilating requirements. The enclosure, and/or the rack housed within the enclosure, can be configured to permit one or more air ducts having multiple fans to be mounted in the rack adjacent to and between equipment components using side-by-side airflow to increase a volume of cooling air directed to air intakes along the components. Air ducts can be configured and disposed within the rack such that the multiple fans draw cooling air into the air ducts and the air ducts direct cooling air into the chamber or plenum. The enclosure and/or the rack can thereby be configured to pressurize the chamber or plenum by increasing volumes and/or flow rate of cooling air into the chamber or plenum. Increased volumes of cooling air can be provided to equipment using side-to-side airflow for cooling when the equipment is housed in an enclosure and/or mounted to a rack that is configured to provide front-to-back airflow. Performance reliability and useful life of electronic equipment using side-to-side airflow can be increased and overheating and equipment shutdown reduced when housed in a standard enclosure providing front-to-back airflow in comparison to other cooling solutions.

An enclosure, and/or a rack housed within the enclosure, configured to simultaneously accommodate the cooling and ventilating requirements of equipment using front-to-back airflow and equipment using side-to-side airflow can allow the rack to operate at a high power density. The enclosure and the rack can house a mix of different types of equipment using front-to-back airflow or side-to-side airflow within a single enclosure means, and can thereby eliminate the need for two separate enclosures and racks, each configured to meet one type of airflow required for cooling and ventilating. The single enclosure means, therefore, can reduce floor space required to house different types of equipment. An enclosure, and/or a rack housed within the enclosure, configured to simultaneously accommodate the cooling and ventilating requirements of equipment using front-to-back airflow and equipment using side-to-side airflow can accept and accommodate cooling needs of equipment components, e.g., using side-to-side airflow, having different front-to-back depths as well as having air intake vents located at various sites along the components. Various barriers, partitions, panels, interconnections, gaskets, grommets and the like can be used to configure an enclosure interior, and/or a rack disposed in the enclosure, to provide front-to-back airflow and side-to-side airflow within a single enclosure means, and to separate cooling air from exhaust air.

An enclosure, and/or a rack housed within the enclosure, can be configured and arranged to separate exhaust air from intake air drawn by equipment using side-to-side airflow such that operating temperatures of the equipment can be reduced. Reduced operating temperatures can increase the lifetime of the equipment and can reduce the frequency of overtemperature alarms on the equipment. An enclosure, and/or a rack housed within the enclosure, can be configured and arranged to separate exhaust air from intake air drawn by side-to-side airflow equipment to help to reduce intake air volume and to increase required minimum temperatures of cooling air supplied to the enclosure by a cooling unit or system. An increase in required minimum temperatures of cooling air helps to increase the operating efficiency of the cooling unit or system. Performance reliability and useful life of IT rack-mounted electronic equipment can be increased and overheating and equipment shutdown reduced in comparison to other cooling solutions.

An enclosure can provide an interior configured and arranged to effectively separate intake air drawn into the enclosure by equipment components for cooling and ventilating purposes from exhaust air vented by the components during operation. Separating cooling air from hot and warm exhaust air can help to prevent/minimize mixing of cooling air with exhaust air and thereby can help to prevent/minimize the extent that exhaust air circulates to equipment air intakes. As a result, insufficient cooling and overheating of equipment components during operation can be prevented/minimized. Separating cooling air from exhaust air can help to increase temperatures of exhaust return air to a cooling unit or system associated with a data center or network room, which can help to increase an operating efficiency of the cooling unit or system. An increase in temperatures of exhaust air can help to reduce the air volume that the cooling unit or system is required to deliver to the equipment. Separating cooling air from exhaust air can permit the cooling unit or system to supply cooling air at increased temperatures, while maintaining the same operating temperatures of the equipment. Increased temperatures of cooling air supplied to the equipment can further help to improve the efficiency of the cooling unit or system.

Existing standard IT racks and enclosures can be configured and arranged to provide both front-to-back airflow and side-to-side airflow configurations through various sections of racks without significant retrofitting and cost. Standard IT racks and enclosures can enhance the adaptability and the flexibility of data center and equipment room configurations if such racks and enclosures are configured to accept and to appropriately cool different types of electronic equipment simultaneously mounted within a single rack/enclosure means. IT racks and enclosures that can accommodate the operation requirements of different types of equipment, such as a mix of IT and telecommunications equipment can provide greater ease and flexibility in reconfiguring equipment and efficient use of data center and equipment room space.

DETAILED DESCRIPTION OF PREFERRED EMBODIMENTS

Aspects of the invention include an equipment rack enclosure having an interior configured for facilitating defined airflow conditions within the enclosure to meet cooling and ventilating requirements of rack-mounted equipment where the enclosure interior is structured and/or arranged to permit front-to-back airflow, e.g., used by information technology (IT) equipment, and side-to-side airflow, e.g., used by certain types of telecommunications equipment. An exemplary enclosure includes at least a first air intake plenum defined in the enclosure interior and disposed to contain cooling air that is directed and/or diverted from a front-to-back airflow to permit air to flow side-to-side through one or more sections of a rack. Different embodiments of an enclosure according to the invention permit an enclosure interior to be configured or adapted to accommodate different dimensions, e.g., depths, of different types of electronic equipment, while permitting airflow to meet the cooling and ventilating requirements of the different types of equipment. Embodiments according to the invention permit an enclosure to simultaneously contain telecommunications equipment and IT equipment such that cooling and ventilating requirements of each type of equipment are met. Other embodiments are within the scope of the invention.

Figure 1:
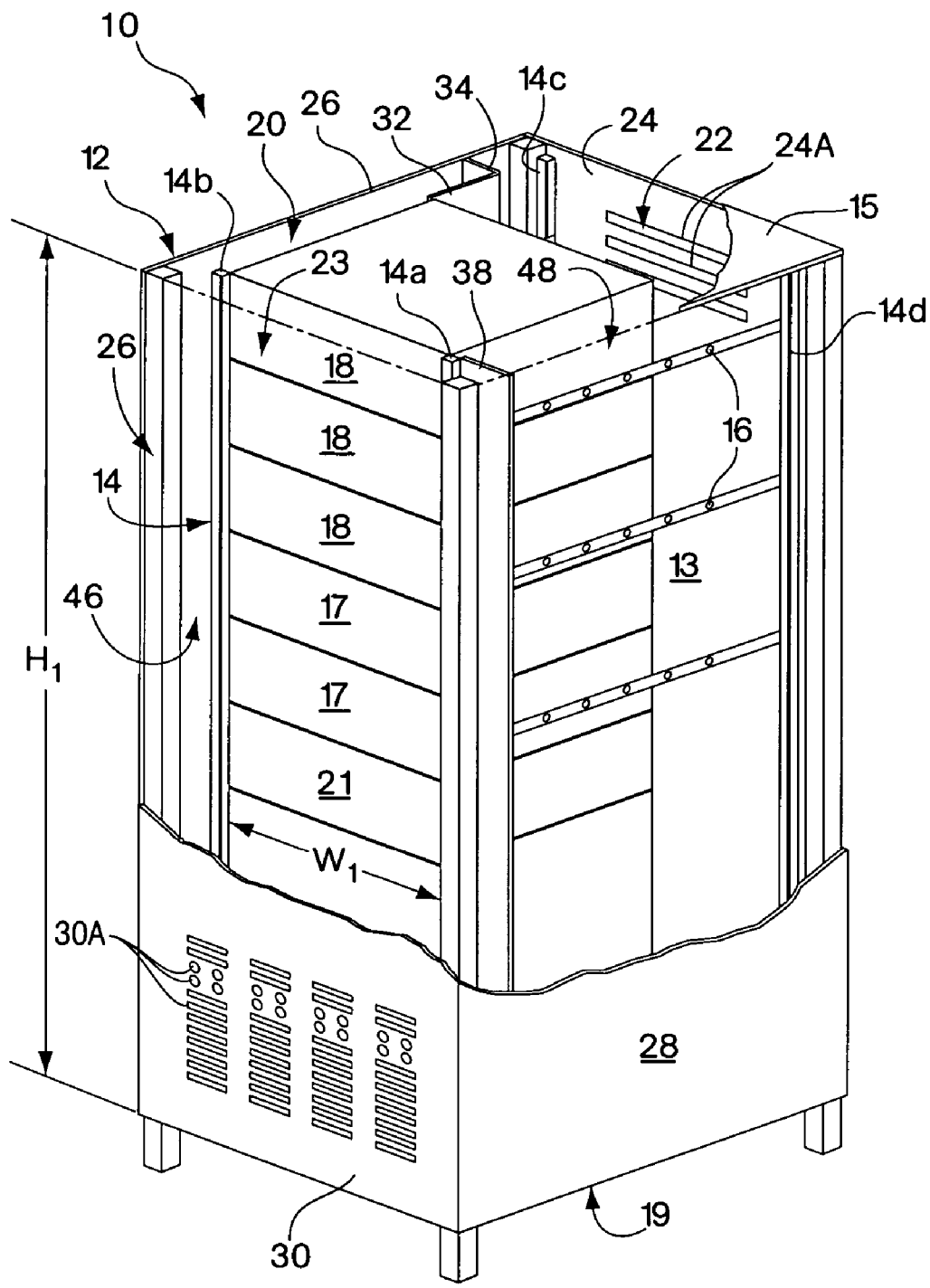
FIG. 1 is a cut-away perspective view of an equipment enclosure according to the invention.

Referring to FIG. 1, an equipment rack enclosure 10 includes an enclosed housing 12 and a rack 14. The housing 12 is configured and sized to define an interior 13 sufficient to contain or enclose the rack 14. In one embodiment, the housing is configured and sized to enclose the rack 14 in a substantially centered position. The housing 12 includes side panels 26 and 28 disposed on each side of the rack 14 to enclose the rack 14 and to define the housing 12. In one embodiment, the housing 12 further includes a vented rear panel 24 and a vented front panel or door 30. The front door 30 and the rear panel 24 of the housing 12 are configured and arranged to permit airflow through the rack 14. The door 30 is disposed to permit cooling air, e.g., ambient air of an equipment room or data center, to flow through multiple air vents 30A defined in the door 30 to the housing interior 13. The rear panel 24 is disposed to permit exhaust air to flow through multiple vents 24A defined in the rear panel 24 to an area external to the housing interior 13. In one embodiment, the housing further includes a top panel 15 and a bottom panel 19 that further define the housing 12.

In one embodiment, the rack 14 includes four vertical mounting rails 14a, 14b, 14c and 14d disposed to help to define a frame and an equipment area in which electronic equipment, e.g., information technology (IT) components 17 and/or telecommunications components 18, are disposed. The rack 14 can further include one or more horizontal mounting members 16 that extend from a front portion to a back portion of the housing 12 to help to define the equipment area and to mount the equipment 17 and 18. In another embodiment, the front mounting rails 14a and 14b of the rack 14 can be connected to front ends of one or more of the mounting members 16 and the back mounting rails 14c and 14d can be connected to back ends of the members 16 to help to define the rack 14 and the equipment area. One or more of the mounting rails 14a, 14b, 14c and 14d can be connected to one or more of the top panel 15, the bottom panel 19, the side panels 26 and 28, the front door 30 and the rear panel 24 to position and securely dispose the rack 14 within the housing interior 13.

The mounting rails 14a, 14b, 14c and 14d are disposed and configured such that the equipment components 17 and 18 are mounted thereto to dispose or rack-mount the equipment components 17 and 18 in the defined equipment area. In one embodiment, the front mounting rails 14a and 14b are configured to permit equipment, e.g., the IT components 17, to be mounted at a desired vertical height and depth in the rack 14, depending upon the U height, depth and other dimensions of the equipment. The mounting rails 14a, 14b, 14c and 14d can be disposed in the housing 12 such that the equipment components 17 are approximately centered when rack-mounted.

Embodiments of the enclosure 10 according to the invention can include the mounting rails 14a, 14b, 14c and 14d and/or the multiple mounting members 16 to rack-mount a mix of different types of equipment components, such as a mix of the IT and telecommunications components 17 and 18.

In one embodiment, the enclosure 10 is sized to enclose the rack 14 having a 19-inch width $W_1$ or a 23-inch width $W_1$. The rack 14 is configured to accept and to mount the equipment components 17 and 18 having a 19-inch width or a 23-inch width. In one embodiment, the rack 14 can have a 23-inch width $W_1$ and can be further configured to accept and to mount exclusively equipment having a 19-inch width, e.g., the IT components 17, or equipment having a 23-inch width, e.g., the telecommunications components 18. In another embodiment, the 23-inch rack 14 can be further configured to accept and to mount simultaneously a mix of equipment having either a 19-inch or a 23-inch width, e.g., a mix of the IT and the telecommunications components 17 and 18.

The enclosure 10 can have overall dimensions to house the rack 14 such that, for example, the space 46 along the left side of the rack 14 is sized to help to increase/optimize airflow along the left side of the rack 14, as described below in further detail. In different embodiments of the invention, the rack 14 can be moved from a center position within the enclosure 10 to increase one of the open spaces 46 and 48.

In one embodiment, the enclosure 10 can have overall dimensions to accommodate the rack 14 with a 23-inch width $W_1$. In this embodiment, the 23-inch enclosure 10 is sized to house the rack 14 having either a 19-inch or 23-inch $W_1$, thereby providing the enclosure 10 with flexibility and adaptability with respect to the types of equipment 17 and 18 it can contain at once. The enclosure 10 can have a width ranging from, but not limited to, about 24 inches to about 30 inches or more. The invention, however, is not limited to the enclosure 10 having specific overall dimensions, and, in particular, is not limited to a certain width and anticipates dimensions to accommodate different sizes and widths of the rack 14 and/or the equipment 17 and 18. The enclosure is sized and configured to accommodate the type and the distribution of the equipment components 17 and 18 mounted in the rack 14, and to help to increase/optimize airflow in the housing interior 13. Promoting and increasing airflow in the housing interior 13, e.g., along the left side of the rack 14, helps to configure side-to-side airflow conditions within the housing interior 13.

Figure 2:
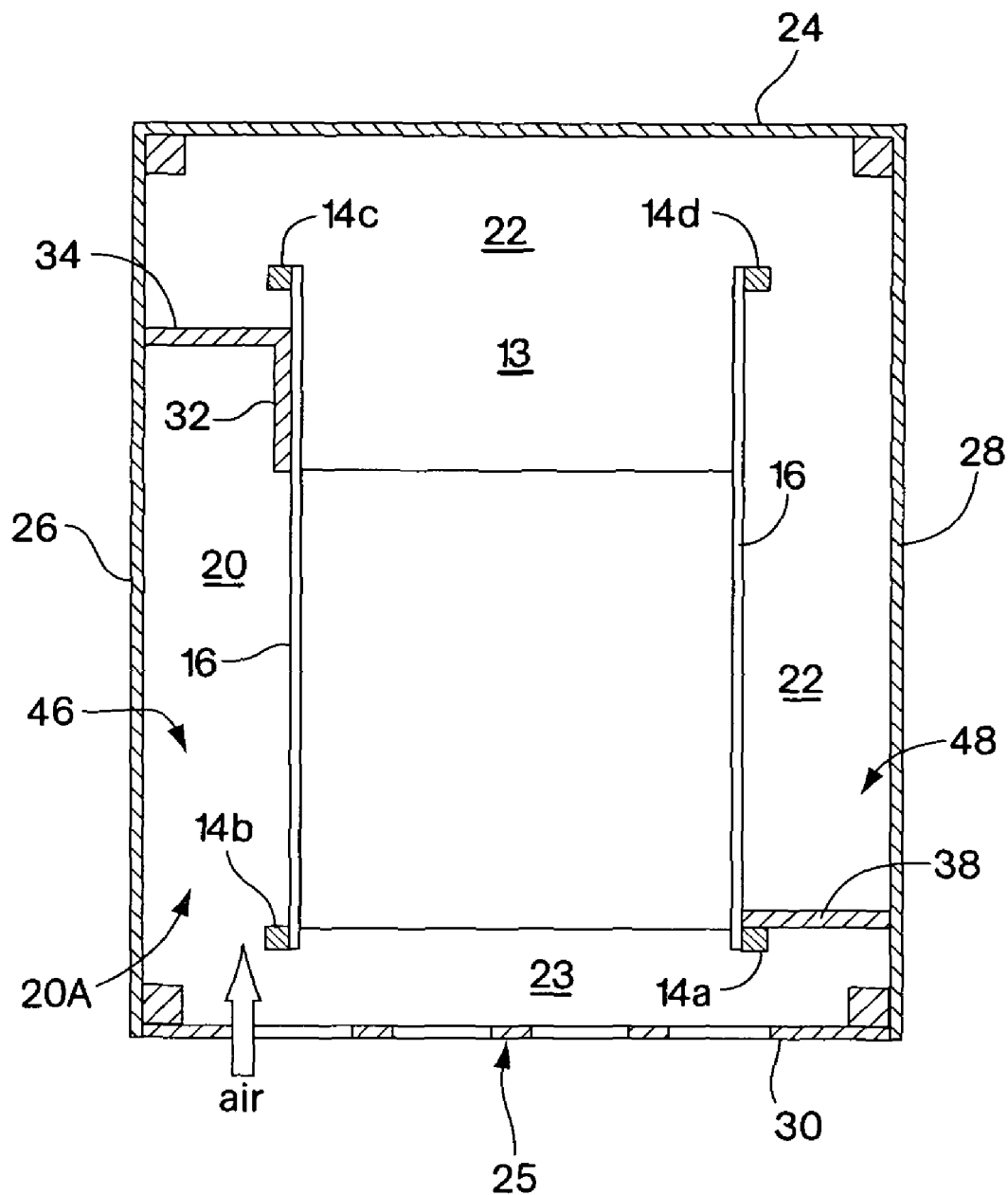
FIG. 2 is a top view cross section of the enclosure shown in FIG. 1 with a top panel removed.

Referring to FIG. 2 illustrating a top view cross-section of the enclosure 10, and with further reference to FIG. 1, in one embodiment, the housing interior 13 is configured to define at least a first air intake plenum 20 along a left side of the rack 14 in the open space 46 between the side panel 26 and the rack 14. The housing interior 13 is further configured to define a first exhaust air plenum 22 along a side and back portion of the enclosure 10. One or more barriers or partitions 32, 34 and 38 are configured and positioned in the spaces 46 and 48 between the side panels 26 and 28 and the rack 14 to help to define the first air intake plenum 20 and/or the exhaust plenum 22. The first air intake plenum 20, as described below in further detail, is a substantially enclosed configuration that is constructed and arranged along the left side of the rack 14 to receive and to contain cooling air from which equipment using side-to-side airflow for cooling may drawn from to meet its cooling and ventilating needs. The first intake plenum 20 defined within the housing interior 13 thereby helps to configure a side-to-side airflow used by the telecommunications equipment 18.

The one or more barriers or partitions 32, 34 and 38 are further configured and positioned to help to serve as a barrier or partition separating the first air intake plenum 20 from the exhaust plenum 22, and to thereby help to prevent circulation of exhaust air from the exhaust plenum 22 into the first air intake plenum 20. As will be described in further detail below, the partitions 32, 34 and 38 can be configured and arranged within the housing interior 13 to accommodate the different dimensions and, in particular, the different depths of the equipment 17 and 18 to achieve separation of cooling air from exhaust air. The top panel 15 and the bottom panel 19 of the housing 12 can further define the first intake plenum 20 and/or the exhaust plenum 22.

In one embodiment, the first intake plenum 20 is substantially enclosed having an open end 20A in fluid communication with a front portion of the housing interior 13 or an air intake side 25 of the rack 14. As shown in FIG. 2, the plenum 20 is disposed and configured to receive laterally directed and/or diverted flow of cooling intake air drawn into the housing 12 from the air vents 30A in the door 30 along the front portion of the housing interior 13 and/or the air intake side 25 of the rack 14. The first intake plenum 20 is further configured to contain sufficient cooling air from which air intakes of the equipment using side-to-side airflow, e.g., the telecommunications equipment 18, can draw from. In addition, the first intake plenum 20 can be further configured to limit air to flow in a side-by-side configuration through equipment in the rack 14 using side-to-side airflow.

The first intake plenum 20 is further disposed and configured to prevent/reduce air loss from the plenum 20 and to prevent/reduce airflow from the first intake plenum 20 to the exhaust plenum 22. The first intake plenum 20 helps to prevent/reduce exhaust air from circulating to the air intake side 25 and into the plenum 20. The plenum 20 and the top and bottom panels 15 and 19 can prevent airflow from a center, a top or a back portion of the rack 14 to the air intake side 25 and into the plenum 20. The plenum 20 is essentially disposed and configured or set up within the housing interior 13 to separate cooling intake air drawn into the front portion of the housing interior 13 from hot and warm exhaust air vented along the back portion of the rack 14. Separating cooling air from exhaust air prevents/minimizes the circulation of exhaust air to the air intake side 25 and the plenum 20, and prevents/minimizes mixing of cooling air with exhaust air during operation of the equipment 17 and 18.

In one embodiment, as shown in FIGS. 1-2, one or more partitions 32 and 34 are disposed on the left side of the rack 14 between the side panel 26 and one or more of the members 16 extending front-to-back along the left side of the rack 14 to define the first intake plenum 20. The one or more partitions 32 and 34 are disposed and configured to help to form a substantially airtight barrier between the first intake plenum 20 and the exhaust plenum 22 and to thereby help to separate cooling intake air within the plenum 20 from exhaust air vented to the exhaust plenum 22.

Figure 3:
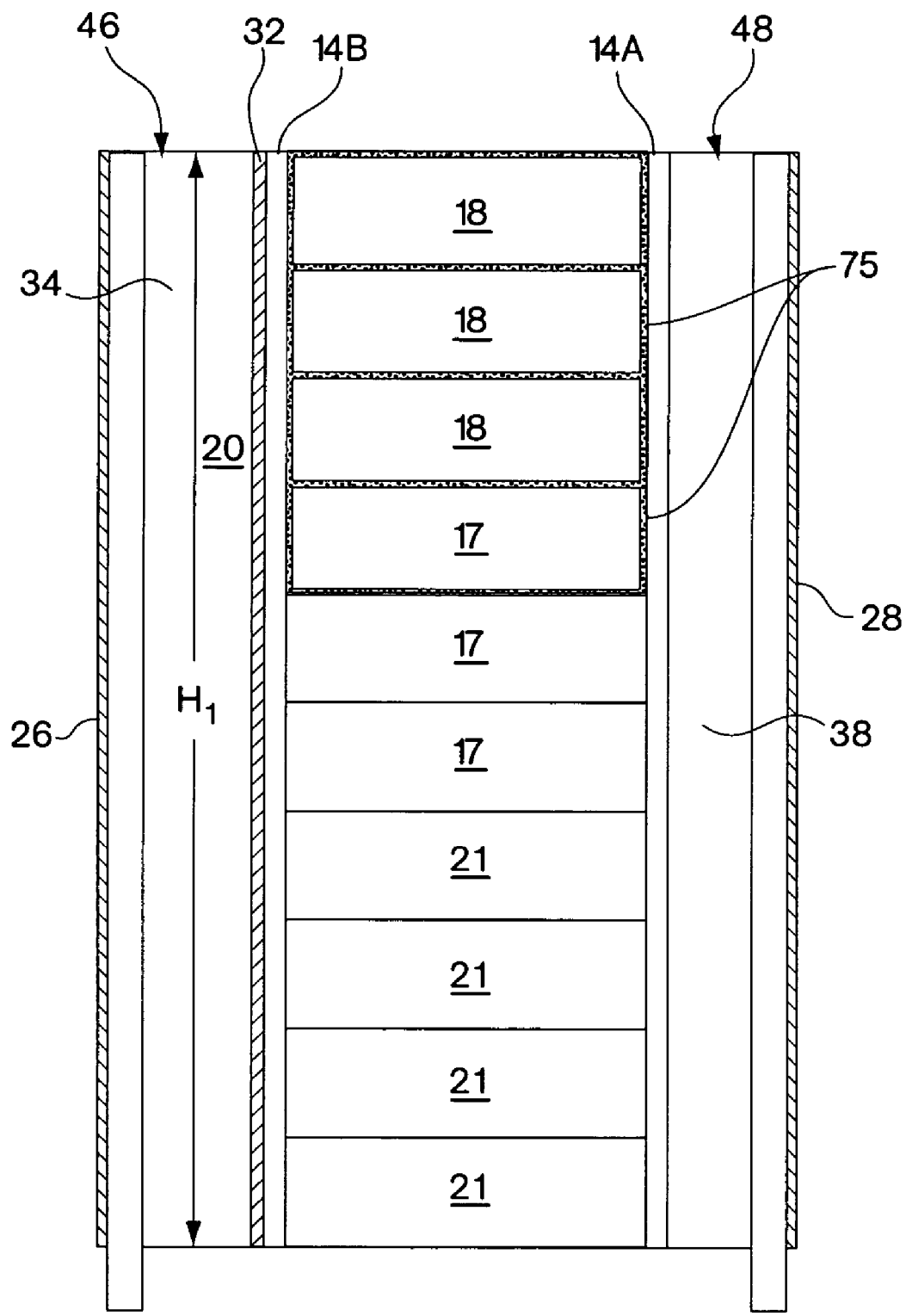
FIG. 3 is a front view of the enclosure shown in FIG. 1 with a front panel removed.

Referring to FIG. 3 illustrating a front view of the housing interior 13, and with further reference to FIGS. 1-2, in one embodiment, one partition 32 is disposed in a substantially parallel orientation to the left side panel 26 and the other partition 34 is disposed in a substantially perpendicular orientation to the left side panel 26. The partitions 32 and 34 can be joined or connected at an angle to help to define the first intake plenum 20. In one embodiment, the partition 32 disposed substantially parallel to the left side panel 26 extends vertically along at least a portion of the height $H_1$ of the rack 14, and the partition 34 disposed substantially perpendicular to the left side panel 26 similarly extends vertically along at least a portion of the rack height $H_1$ to define the first intake plenum 20.

In another embodiment, the partition 32 disposed substantially parallel to the left side panel 26 can be disposed and connected to the member 16 of the rack 14 such that the partition 32 extends from the member 16 to the left side panel 26 to help to define the first intake plenum 20, thereby eliminating the need for the partition 34.

Referring further to FIGS. 1-2, the partition 38 on the right side of the rack 14 is disposed and configured to help to define a front air intake plenum 23. The front air intake plenum 23 can include the front portion of the interior 13 of the housing 12 between the door 30 and the rack 14. The front air intake plenum 23 is configured and sized to receive air drawn into the front portion of the housing interior 13 from the vented front panel or door 30 along the air intake side 25 of the rack 14. The partition 38 is further configured to help to define the exhaust plenum 22. The partition 38 is disposed in a substantially perpendicular orientation to the right side panel 28 of the housing 12 and extends vertically along at least a portion of the height $H_1$ of the rack 14 and/or the housing interior 13. The partition 38 is further configured to form a substantially airtight barrier between the front intake plenum 23 and the exhaust plenum 22. The partition 38 thereby helps to prevent airflow from the front portion of the rack 14 to the exhaust plenum 22, and helps to prevent exhaust air from circulating to the first and the front intake plenums 20 and 23 and from mixing with cooling intake air contained therein. The right side partition 38, along with the partitions 32 and 34 on the left side of the rack 14, separate cooling intake air drawn into the housing interior 13 by the equipment 17 and 18 during operation from hot and warm exhaust air vented to the exhaust plenum 22.

Figure 4A:
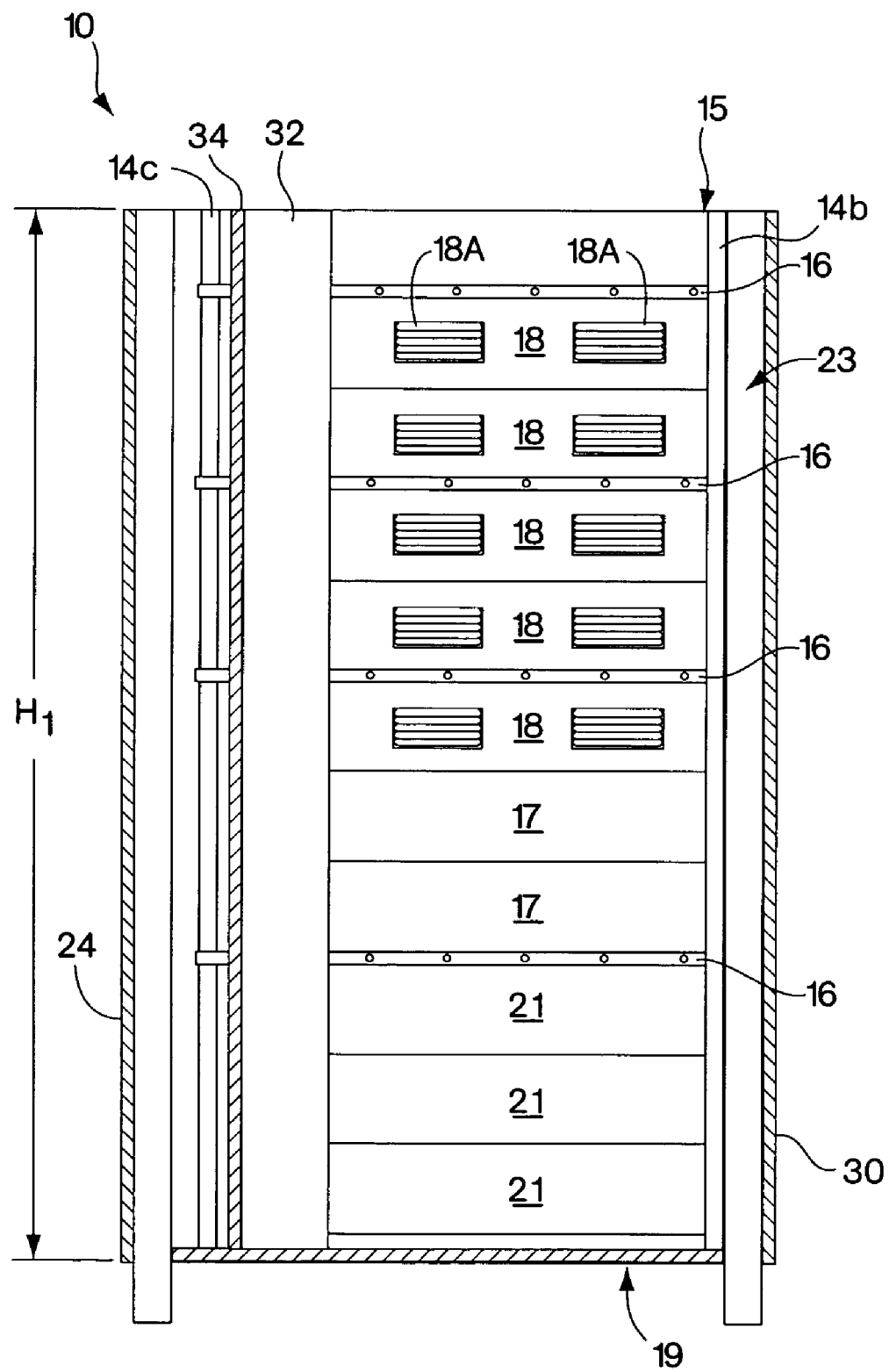
FIGS. 4A-4B are left side view cross sections of the enclosure shown in FIG. 1 with a left side panel removed.

Referring to FIG. 4A illustrating a left side view cross section of the enclosure 10, and with further reference to FIG. 3, in one embodiment, the partitions 32 and 34 extend vertically along substantially the entire height $H_1$ of the rack 14 and/or the housing interior 13 to help to define the first intake plenum 20 between the left side panel 26 and the equipment components 17 and 18.

Figure 4B:
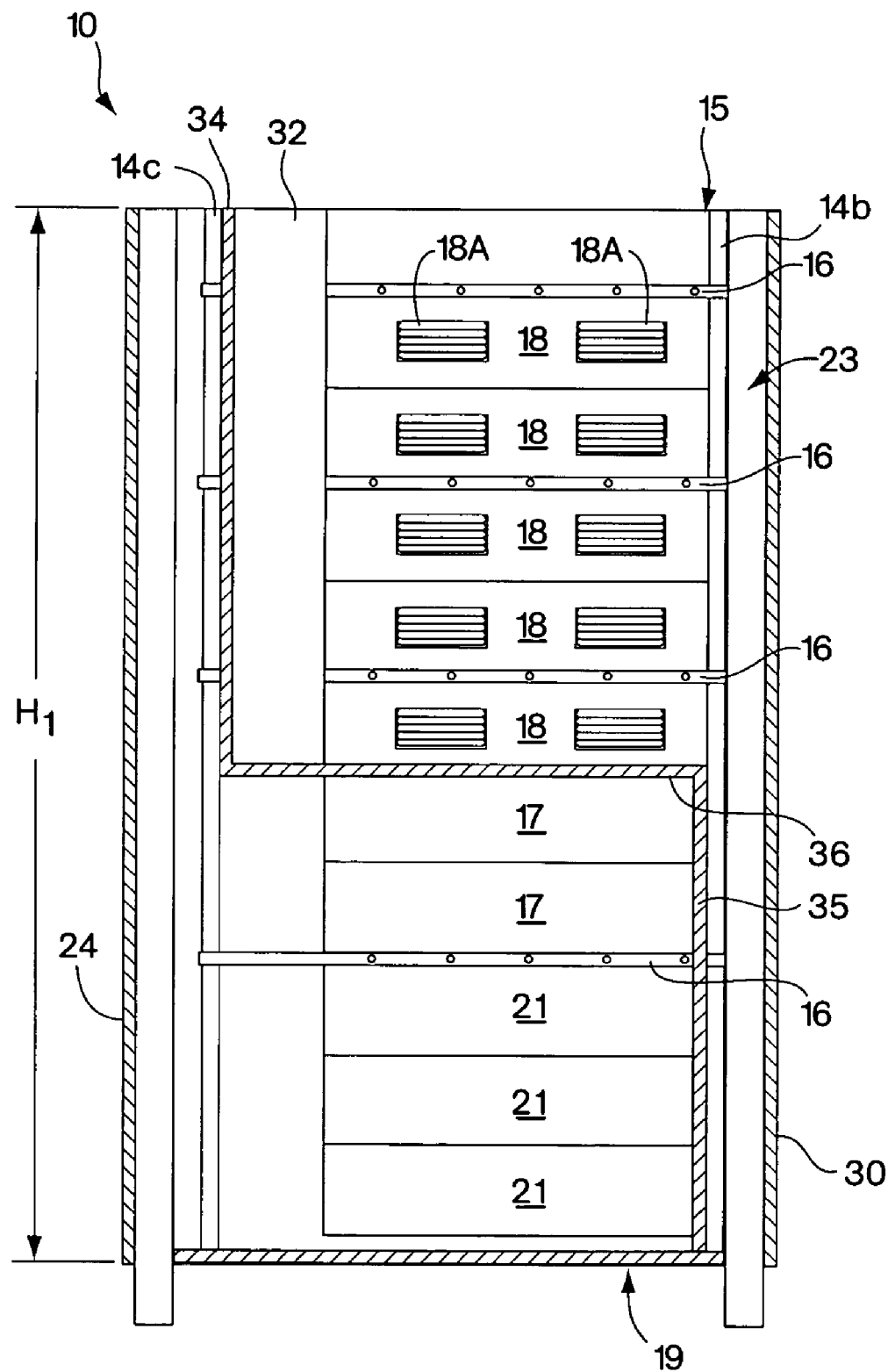

Referring to a left side view cross section illustrated in FIG. 4B, in another embodiment, each partition 32 and 34 extends vertically and equally with the other partition along only a portion of the height $H_1$ of the rack 14 and/or the housing interior 13 to the extent or the U heights of the telecommunications components 18 mounted vertically in the rack 14. In this case, a front partition 35 and a bottom partition 36 are disposed in the space 46 to help to define the first intake plenum 20 and to limit its configuration to the extent of the telecommunications components 18 in the rack 14. The front partition 35 is connected at a front side of the rack 14, e.g., either to the rack 14 or, if present, to a side or front portion of the member 16. The front partition 35 extends to the left side panel 26 of the housing 12 in a substantially perpendicular orientation to the panel 26 and downward along the $H_1$ of the rack 14 to the bottom panel 19. The front partition 35 is connected or joined to the bottom panel in an appropriate manner and by appropriate means, as described below in further detail. The bottom partition 36 extends from a front to a back portion of the rack 14 along the left side of the rack 14 in a substantially parallel orientation to the bottom panel 19. As shown in FIG. 4B, the front and the bottom partitions 35 and 36 intersect and are connected or joined in an appropriate manner and by appropriate means. In addition, the bottom partition 36 is joined or connected in an appropriate manner and by appropriate means to a portion, e.g., a bottom edge, of each of the partitions 32 and 34. The partitions 32, 34, 35 and 36 thereby help to define and to limit the plenum 20 to those sections of the equipment area of the rack 14 in which the telecommunications components 18 are mounted. The plenum 20 is essentially configured to receive cooling intake air drawn from the front portion of the housing interior 13 and/or the intake side 25 of the rack 14, and to contain cooling air to facilitate a side-to-side airflow condition the telecommunications components 18 use for cooling and ventilating.

Figure 5A:
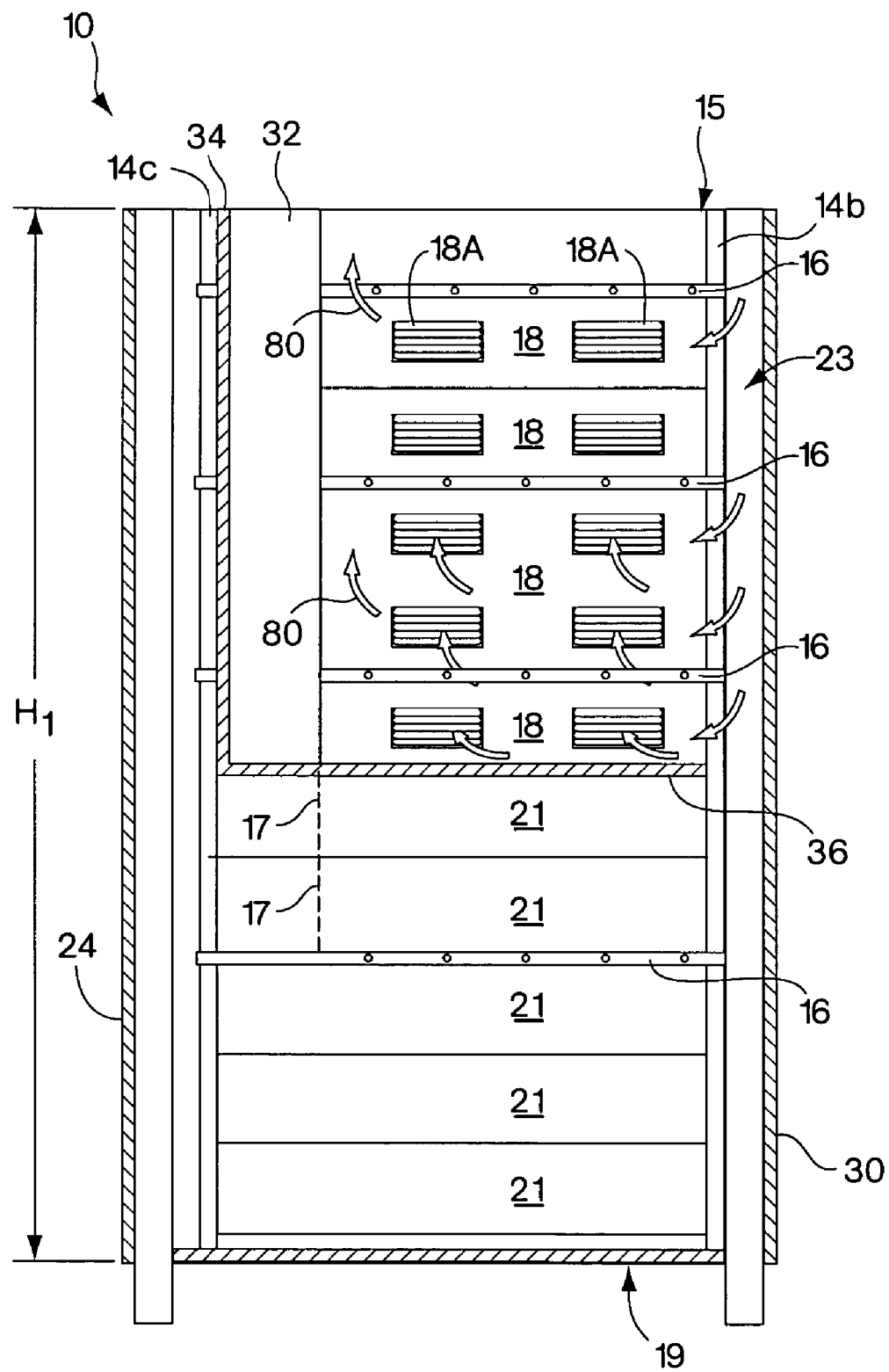
FIG. 5A is a left side view cross section of the enclosure shown in FIG. 1 with the left side panel removed.
Figure 5B:
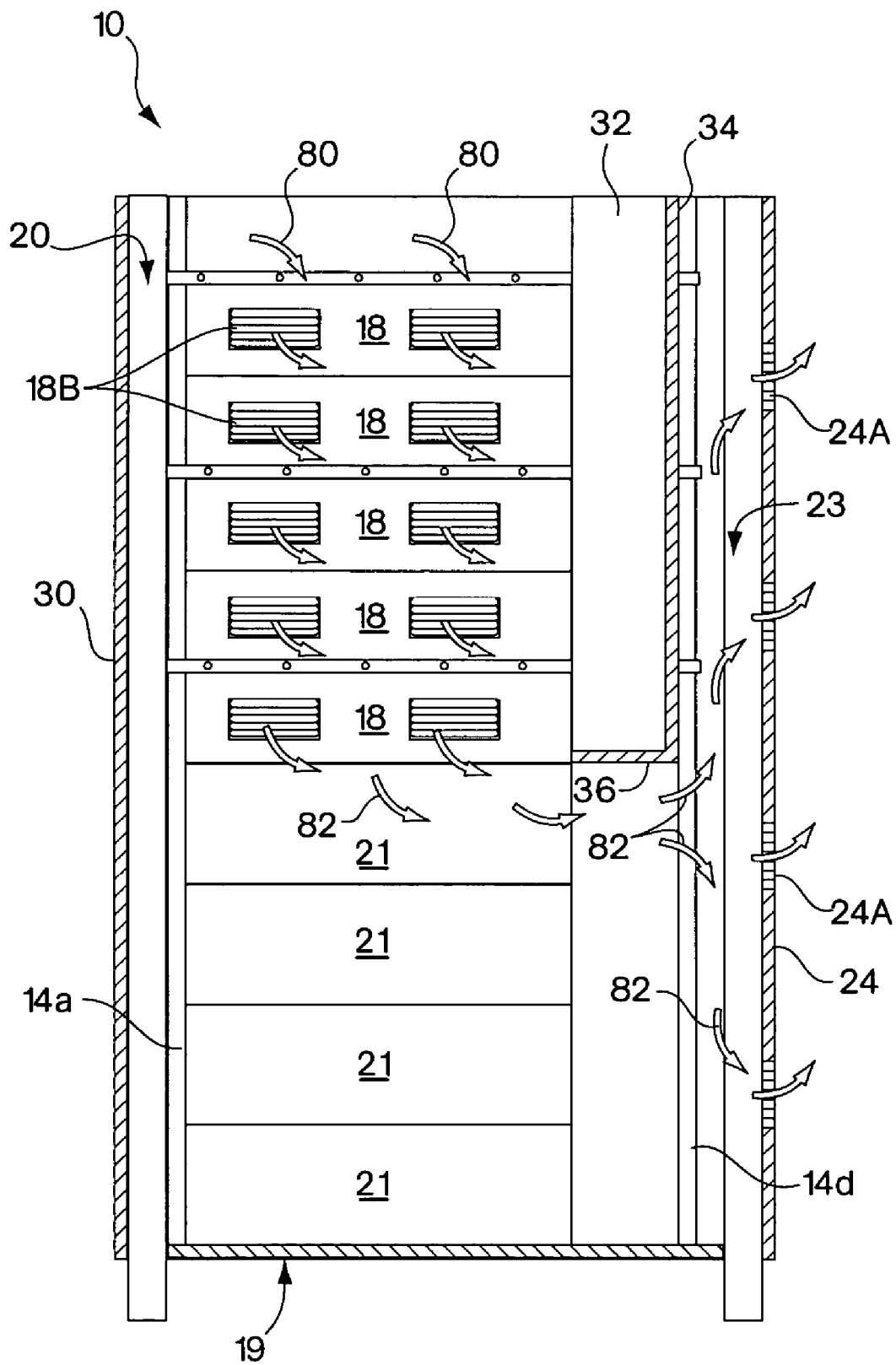
FIG. 5B is a right side view cross section of the enclosure shown in FIG. 1 with the right side panel removed.

Referring to FIGS. 5A-5B, and with further reference to FIGS. 4A-4B, in one embodiment, multiple blanking panels 21 can be mounted to one or more of the mounting rails 14a, 14b, 14c and 14d and/or the members 16 along each side or the front of the rack 14 to block sections of the equipment area that are vacant or include components that use front-to-back airflow, e.g., the IT components 17. The blanking panels 21 help to prevent air loss from the first and front intake plenums 20 and 23, from the rack 14, and/or from interfaces of the components 17 and 18 and surfaces of the rack 14. As shown in FIG. 5A, multiple blanking panels 21 can be mounted to the mounting rails 14b and 14c and/or one or more of the members 16 at sections of the rack 14 along its left side that include the components 17 and 18 or are vacant sections without equipment. The multiple blanking panels 21 cover the components 17 and the vacant sections to help to prevent/minimize air loss from the left side of the rack 14. As shown in FIG. 5B, illustrating a right side view cross section of the enclosure 10 and the exhaust side of the telecommunications components 18, multiple blanking panels 21 can be similarly mounted to the mounting rails 14a and 14d and/or the members 16 to cover the IT components 17 and the vacant sections of the rack 14 along the right side of the rack 14.

In one embodiment, use of the blanking panels 21 can help to permit air to flow upward over a top of the rack 14, as shown by arrows 80 in FIGS. 5A-5B, and to facilitate flow of hot and warm exhaust air vented from the exhaust vents 18B of the telecommunications components 18. Exhaust air within the exhaust plenum 23 can circulate, e.g., in upward and/or downward orientation, as shown by arrows 82 in FIG. 5B. The blanking panels 21 thereby help to facilitate circulation of air over the top of the rack 14 and within the exhaust plenum 23 before it is vented through the rear panel 24, which helps to lower air resistance within the housing interior 13.

Figure 6A:
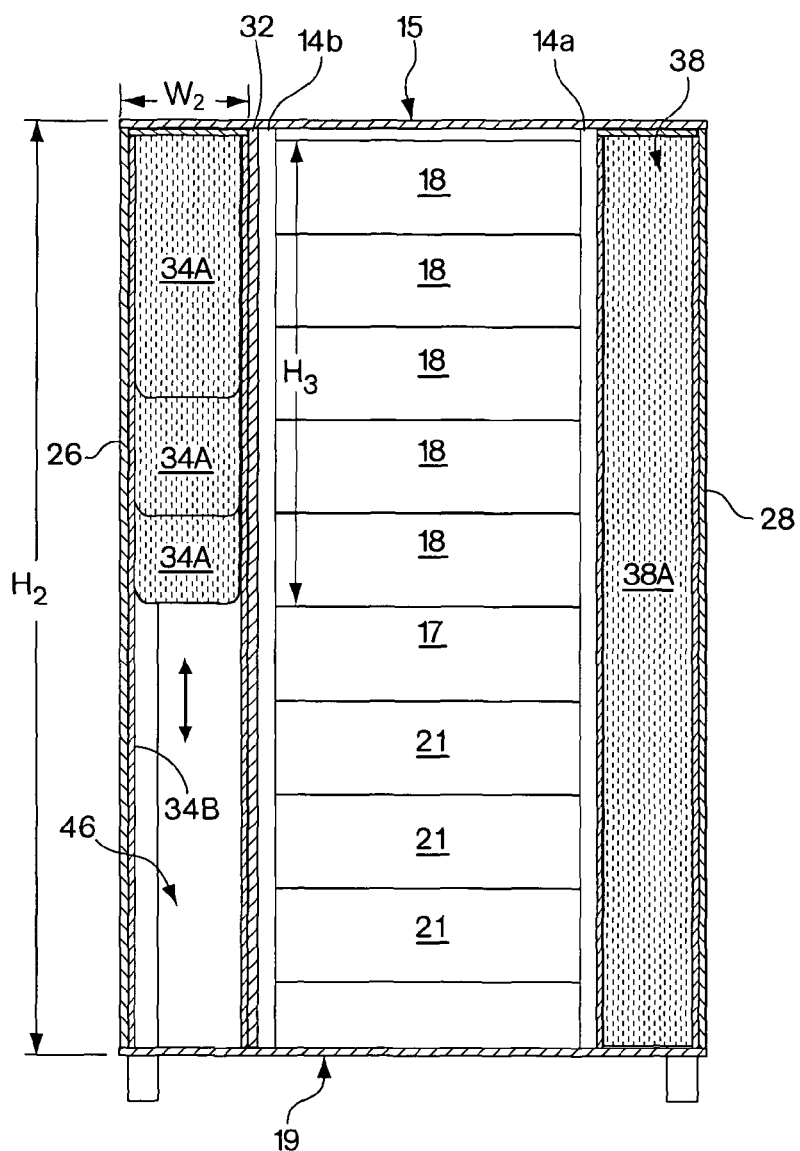
FIG. 6A is a front view of the enclosure shown in FIG. 1 with the front panel removed illustrating one embodiment of one or more partitions according to the invention.
Figure 6B:
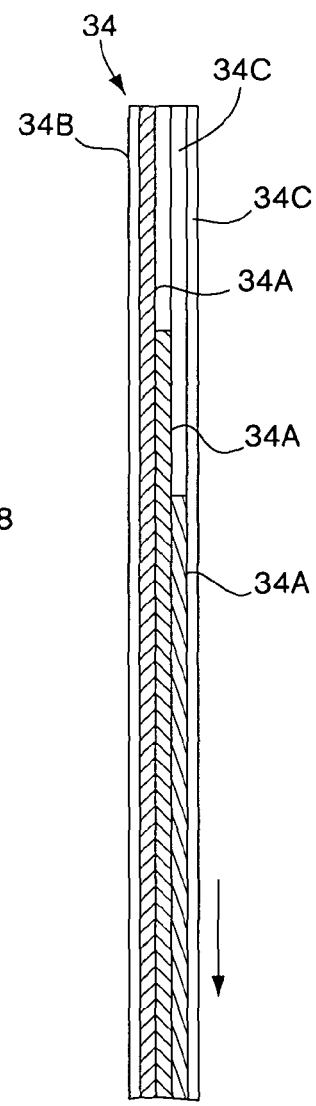
FIG. 6B is a side view cross section of a mounting frame shown in FIG. 6A.

Referring to FIGS. 6A-6B, in one embodiment, one or more of the partitions 32, 34, 35, 36 and 38 can be constructed with specific dimensions, e.g., height and width, to correspond to specific U heights and widths of one or more of the components 17 and 18. In another embodiment, the partitions 32, 34, 35, 36 and 38 can be configured and arranged as either a single partition or as two or more overlapping or stacked partitions. For example, as shown in FIG. 6A, the partition 34 positioned on the left side of the rack 14 can include two or more overlapping partitions 34a disposed within a mounting frame 34b. The mounting frame 34b can have appropriate dimensions, e.g., a height $H_2$ and a width $W_2$, such that the frame 34b can seat in the space 46 defined between the left side panel 26 and the rack 14. In one embodiment, the frame 34b can be constructed and arranged to be removably connected to one or more of the left side mounting rails 14b and 14c, one or more of the rack members 16, the top panel 15, the bottom panel 19 and the side panel 26 to securely position the frame 34b.

In another embodiment, the frame 34b can have dimensions and be constructed such that when the frame 34b is seated in the space 46, an outer perimeter of the frame 34b can bias against one or more of the rack members 16, the top panel 15, the bottom panel 19 and the side panel 26 to position the frame 34b within the housing interior 13.

As shown in FIG. 6B, a side view cross section of the mounting frame 34b is provided and illustrates that the partitions 34a can be slidably disposed in an overlapping arrangement within the frame 34b such that each partition 34a can slide across an adjacent partition 34b. In one embodiment, each of the partitions 34a is slidably mounted within a track or groove 34c defined vertically in an inner surface of the frame 34b. The partitions 34a can be pulled vertically along the height $H_2$ of the frame 34b in a downward/upward direction to extend or shorten the overlapping partitions 34a as needed.

As shown in FIG. 6A, the partitions 34a can be extended or shortened to define a height $H_3$ of the first intake plenum 20 such that the height $H_3$ of the plenum 20 can correspond to the location and the U height of, for example, the telecommunications components 18 in the rack 14. In one embodiment, the partitions 34b can be extended fully along the entire height $H_1$ of the rack 14 and/or the housing interior 13.

As noted above, one or more of the partitions 32, 34, 35, 36 and 38 can be constructed and arranged as a single partition. As shown in FIG. 6A, the partition 38 disposed on the right side of the rack 14, for example, can be a single partition 38a disposed in a mounting frame 38b. The mounting frame 38b is similar to the frame 34b disposed on the left side of the rack 14, and has appropriate dimensions such that the frame 38b can seat in the space 48 defined between the right side panel 28 and the rack 14. Like the frame 34b disposed on the left side of the rack 14, the frame 38b can be constructed and arranged to be removably connected by one or more of the above-described fasteners 44, or can have dimensions and be constructed to permit the frame 38b to bias against one or more of the rack members 16, the top panel 15, the bottom panel 19 and the side panel 26 when seated in the space 48.

Figure 7A:
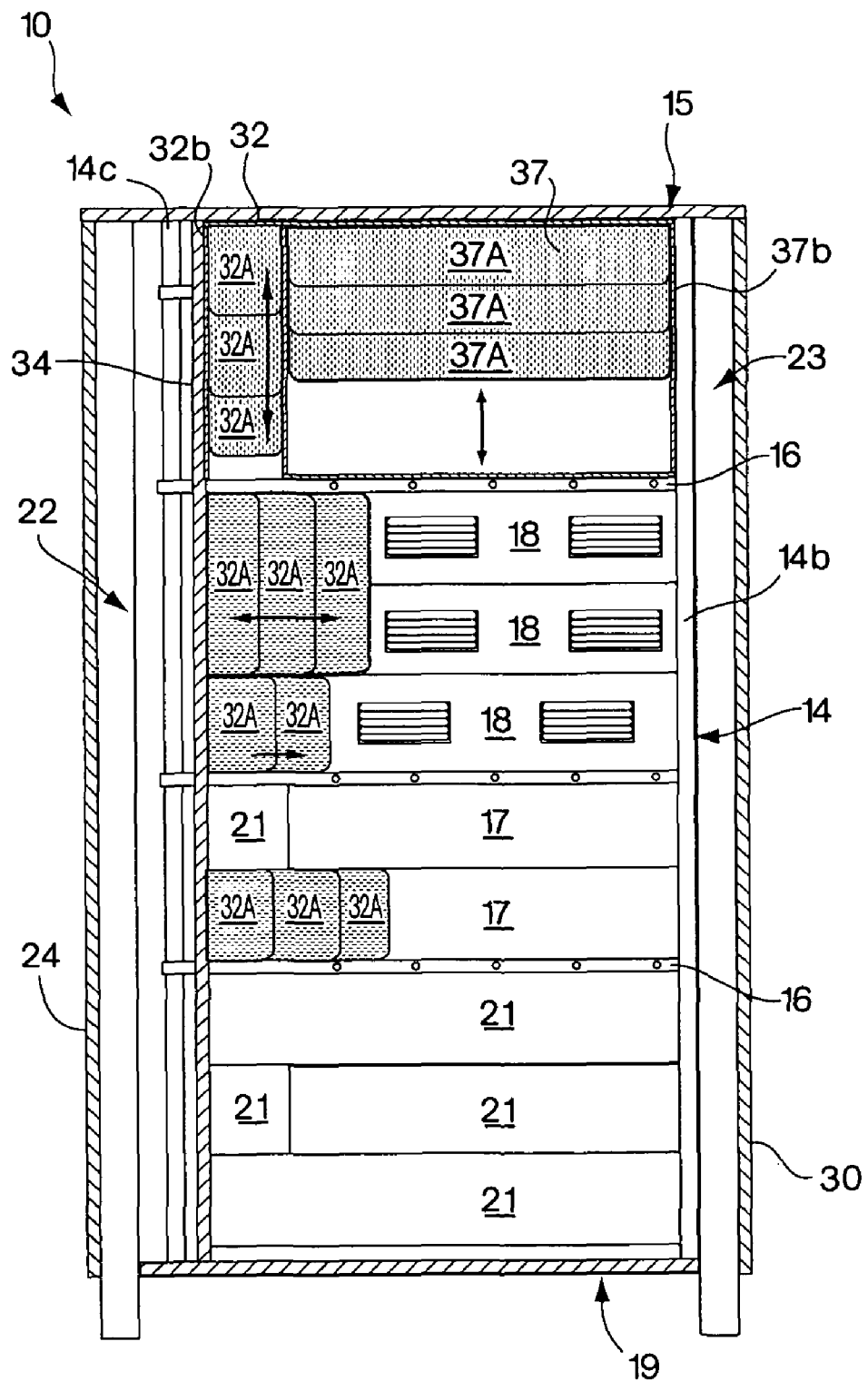
FIG. 7A is a left side view cross section of the enclosure shown in FIG. 1 with the left side panel removed illustrating embodiments of one or more partitions according to the invention.
Figure 7B:
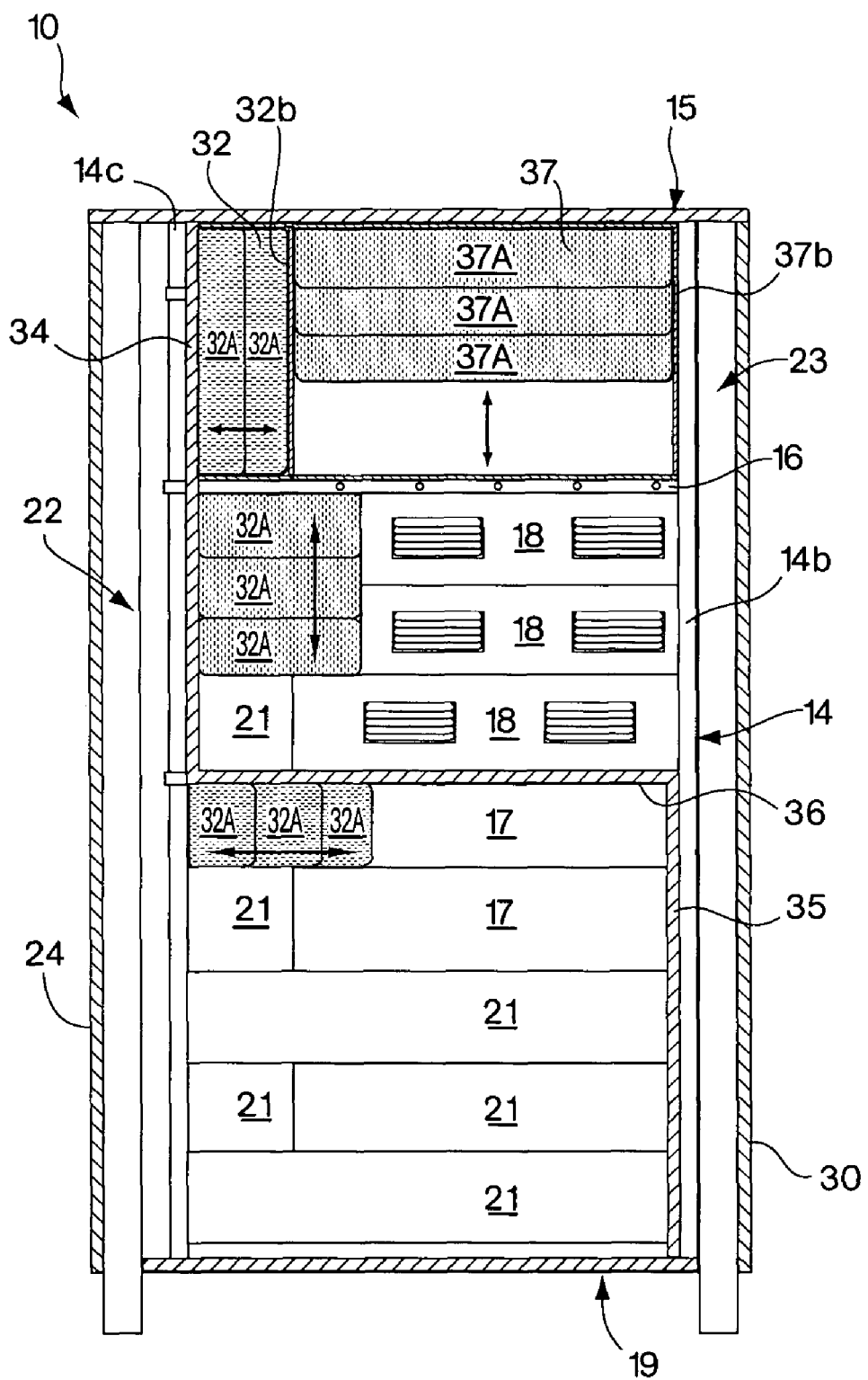
FIG. 7B is a left side view cross section of the enclosure shown in FIG. 1 with the left side panel removed illustrating embodiments of one or more partitions according to the invention.

Referring to FIGS. 7A-7B, in one embodiment, the partitions 32 and 34 and the blanking panels 21 can be configured and disposed along the left side of the rack 14 to accommodate different depths and U heights of the rack-mounted equipment components 17 and 18. As shown in FIGS. 7A-7B, the IT and telecommunications components 17 and 18 simultaneously mounted in the rack 14 can have different depths depending upon the type of the component 17 and 18. The partitions 32 and 34 and the blanking panels 21 can be constructed and arranged in different arrangements and configurations to accommodate space or area defined between the equipment components 17 and 18 and the left back mounting rail 14c or the other partition 34 that results from the different depths of the rack-mounted components 17 and 18. The partitions 32 and 34 and the blanking panels 21 can thereby help to define and configure the first intake plenum 20 along the left side of the rack 14 in response to changes of the mix of the equipment 17 and 18 in the rack 14.

As shown in FIGS. 7A-7B, in one embodiment, the partition 32 can be configured in one or more separate sections disposed along the left side of the rack 14 wherein a single section or two or more sections of the partition 32 define a height that corresponds to the U height of one or more components 17 and 18 and define a depth to accommodate the area between the components 17 and 18 and the partition 34 or the rail 14c. In one embodiment, one or more sections of the partition 32 can have a configuration and arrangement similar to the overlapping partitions 34a shown in FIG. 6A and include overlapping partitions 32a disposed in a mounting frame 32b. The mounting frame 32b holds the partitions 32a in an overlapping manner such that each partition 32a can slidably move over an adjacent partition 32a. The partitions 32a can be slidably moved upward/downward in a vertical direction to extend/reduce a length of the partition 32a, as shown in FIG. 7A, or can be slidably moved forward/backward in a horizontal direction to widen/narrow a width of the partition 32a, as shown in FIG. 7B. The mounting frame 32b can be sized and configured such that the frame 32b seats between the components 17 and 18 and the partition 34 or the left back mounting rail 14c. In another embodiment, the frame 32b can be removably joined or connected to the rail 14c, one or more of the mounting members 16, the partition 34 and/or the top or bottom panel 15 and 19.

Referring further to FIGS. 7A-7B, in different embodiments, the overlapping partitions 32a can be joined or connected removably and directly to the rail 14c, one or more of the members 16, the partition 34 and/or the top or bottom panel 15 and 19. In one embodiment, each partition 32a can be coupled to an adjacent partition 32a such that the partitions 32a are immobile. In another embodiment, each partition 32a can be slidably coupled to an adjacent partition 32a such that the partitions 32a can slide across or against each other in either an upward/downward orientation or a forward/backward orientation. Movement of the adjacent partitions 32a adjusts the height or the depth of the overlapping partitions 32a to accommodate the different depths and U heights of the components 17 and 18. As shown in FIGS. 7A-7B, each of the blanking panels 21 can have different lengths to accommodate the different depths of the equipment components 17 and 18. The partitions 32b and/or the multiple blanking panels help to define the first intake air plenum 20 and to form an airflow blocking barrier between the first intake plenum 20 and the exhaust plenum 22.

In a further embodiment, a blanking partition 37 can be incorporated along the left side of the rack 14, as shown in FIGS. 7A-7B. Like the multiple blanking panels 21, the partition 37 can help to block sections of the equipment area of the rack 14 that are vacant or include components that use front-to-back airflow, e.g., the IT components 17. The partition 37 can help to prevent air loss from the first and front intake plenums 20 and 23, from the rack 14, and/or from interfaces of the components 17 and surfaces of the rack 14. The partition 37 can include a set of overlapping partitions 37a disposed in a mounting frame 37b. The frame 37b can be similarly configured as the frame 34b shown in FIG. 6B. In one embodiment, the partitions 37a can be vertically moved upward/downward in to extend/reduce a length of the partitions 37a.

As shown in FIG. 7A, in one embodiment, the partition 34 extending perpendicular to the rack 14 can extend the height $H_1$ of the rack 14. The partition 32, the overlapping partitions 32a and the blanking panels, therefore, can be joined or connected in an appropriate manner by appropriate means, as described below in further detail. As shown in FIG. 7B, in another embodiment, the partition 34 can extend along the height $H_1$ of the rack 14 only to the extent of the U heights of the components 18 using side-to-side airflow. In this case, the partition 36 extending front-to-back along the left side of the rack 14 is joined or fastened to the partitions 32 and 34. The blanking panels and the overlapping partitions 32a are joined or connected to the left back mounting rail 14c in an appropriate manner by appropriate means to form an airflow blocking barrier.

Figure 8A:
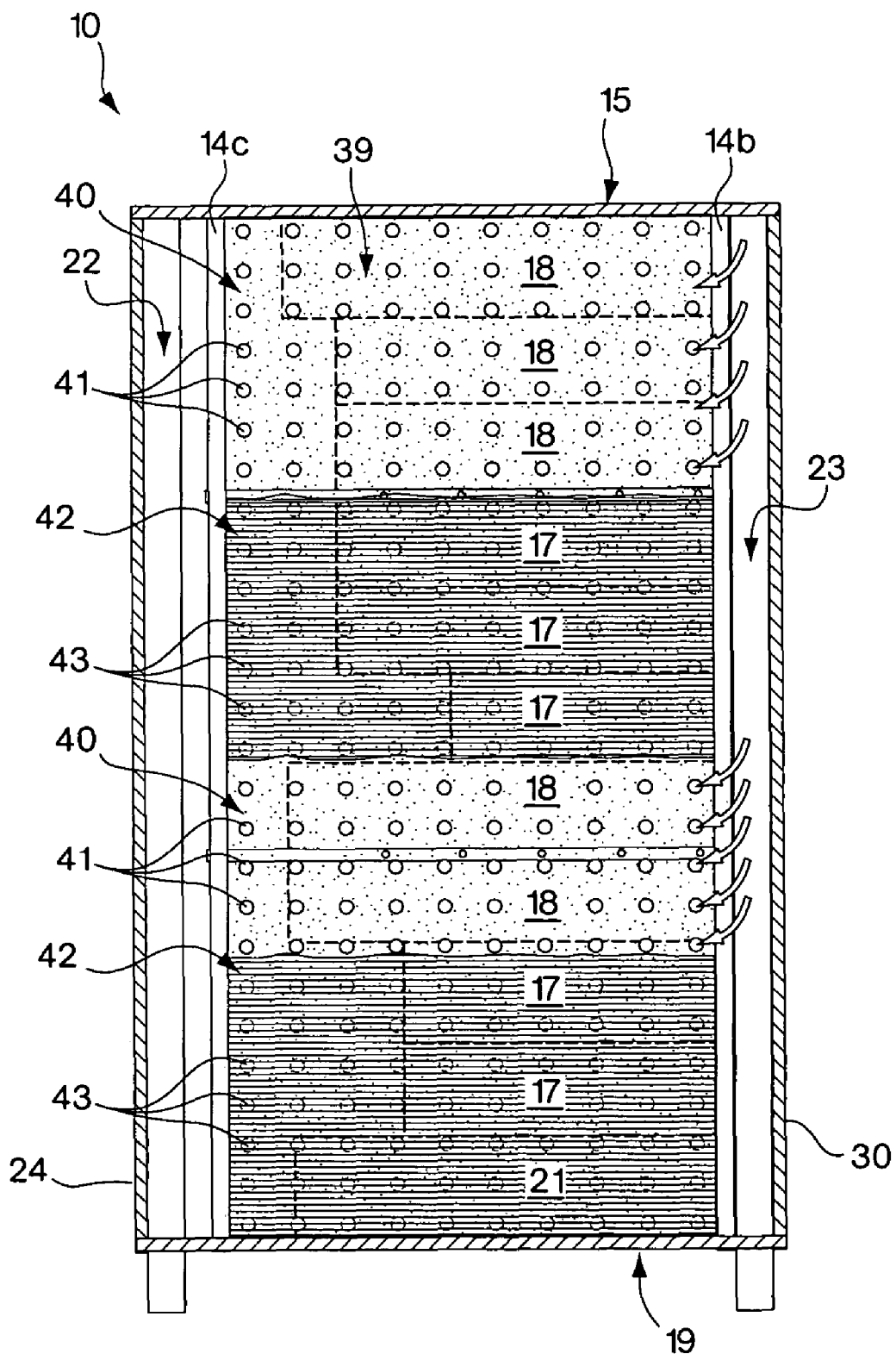
FIG. 8A is a left side view cross section of the enclosure shown in FIG. 1 with one embodiment of a partition according to the invention having multiple vents or holes.
Figure 8B:
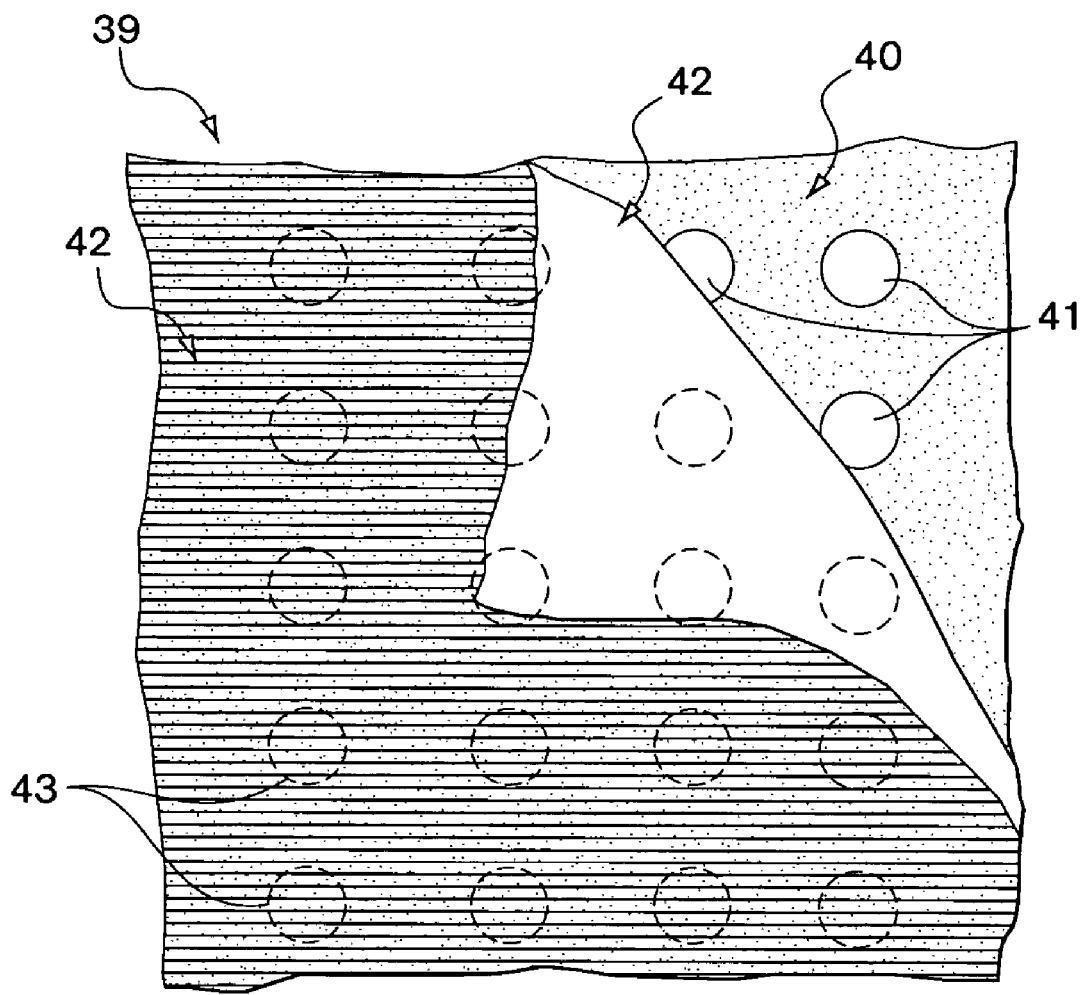
FIG. 8B is a cross-section perspective of a portion of the partition shown in FIG. 8A.

Referring to FIGS. 8A-8B, in one embodiment, a partition 39 is disposed along the left side of the rack 14. In one embodiment, the partition 39 can extend from the front mounting rail 14b to the back mounting rail 14c and substantially along the height $H_1$ the rack 14. In another embodiment, the partition 39 can extend along a portion of the height $H_1$ of the rack 14 to the extent or U heights of adjacent components using side-to-side airflow, e.g., the telecommunications equipment 18. In one embodiment, the partition 39 can be removably joined or connected to one or more of the rails 14b and 14c, the left side mounting members 16 and/or the top or bottom panel 15 and 19.

As shown in a front view of a portion of the partition 39 in FIG. 8B, the partition 39 is constructed of a single sheet of material 40, e.g., a heat resistant polyethylene, that defines multiple vents or openings 41 substantially across its height and width and has a removable covering or film 42, e.g. Mylar®, over its surface. In one embodiment, during installation, the partition 39 is coupled directly to the left side of the rack 14 adjacent to the equipment components 17 and 18. The removable covering or film 42 is slit or cut using an appropriate means, e.g., a cutting edge or knife, and thereafter removed or manually peeled from the surface of the material sheet 40. Removal of the covering 42 permits the multiple vents or openings 41 to be exposed and to thereby permit air to pass therethrough. When coupled to the left side of the rack 14, the multiple vents or openings 41 permit air to flow from the first intake plenum 20 into air intakes 18A disposed along the side of the components 18.

As shown in FIG. 8B, in one embodiment, the cover or film 42 can include printed markings or other indicia 43 to indicate the location of the components 18 using side-by-side airflow when the partition 39 is coupled to the rack 14. In one embodiment, the markings 43 can indicate the location of the air intake vents 18A of the components 18 such that the multiple vents or openings 43 exposed by removing the covering or film 42 will correspond and/or substantially align with the intake vents 18A when the partition 39 is coupled to the rack 14. The multiple vents or openings 43 can help to optimize/increase airflow from the first intake plenum 20 into the intake vents 18A and through the components 18 to configure side-to-side airflow.

In one embodiment, only a portion of the covering or film 42 is removed from the sheet material 40 to the extent of the distribution/location and/or the U heights of the components 18 mounted in the rack 14 using side-by-side airflow. Depending upon the distribution/location of the components 18 and the mix of the rack-mounted IT and telecommunications equipment 17 and 18, the partition 39 can either extend the entire height $H_1$ of the rack 14, or can be limited and extend only along a portion of the rack 14 containing the components 18 using side-to-side airflow. After installation of the partition 39 and the cutting and removal of the covering or film 42, the partition 39 can be adjusted to meet a reconfiguration of the rack 14 and a different mix or distribution of equipment 17 and 18 by placing a removable seal, e.g., tape, labels or Mylar® tabs, over one or more of the multiple vents or openings 43 to accommodate changes in airflow requirements. The multiple vents or openings 41 that no longer correspond to the air intake vents 18A of the components are thereby covered to help to prevent/minimize air loss.

Figure 8C:
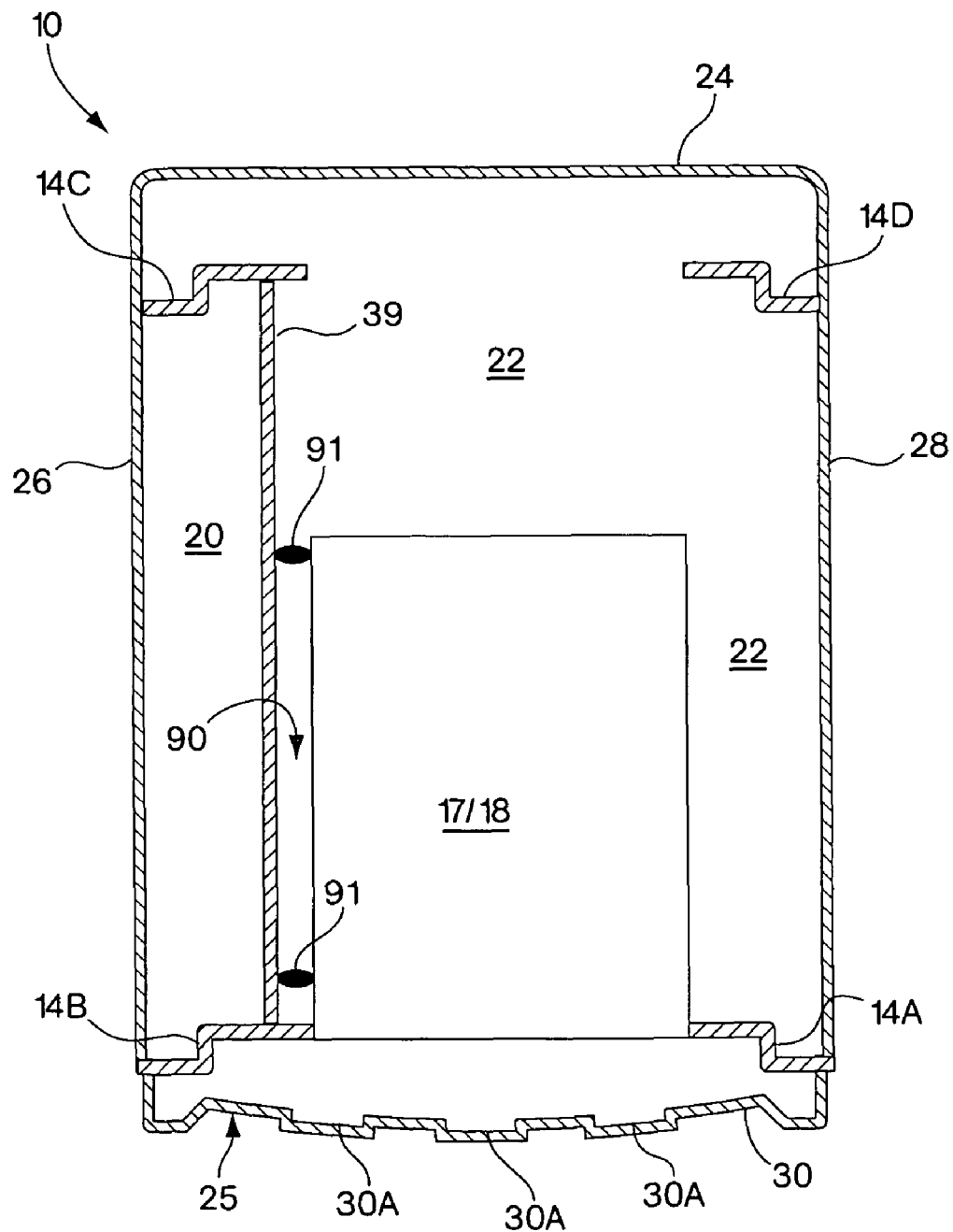
FIG. 8C is a top view cross section of the enclosure shown in FIG. 1 with the top panel removed illustrating one embodiment of the partition shown in FIG. 8A.

Referring to FIG. 8C, the partition 39 can extend from the left front mounting rail 14b to the left back mounting rail 14c. In one embodiment, the left front and back mounting rails 14b and 14c help to define the first intake plenum 20. As described below in further detail, in different embodiments, the rack 14 can have a relatively wide width $W_1$, e.g., 23-inches, and the enclosure 10 can be sized such that the left front mounting rail 14c substantially fills the space 46 between the left front mounting rail 14b and the side panel 26, and the left back mounting rail 14c substantially fills the space 46 between the left back mounting rail 14c and the side panel 26. The partition 39 is removably joined or connected to the left front and back mounting rails 14b and 14c to help to define the first intake plenum 20.

As shown in FIG. 8C, the partition 39 is spaced from the left side of the rack 14 and the equipment 17 and 18 such that the partition 39 and the rack 14 and the equipment 17 and 18 define an area 90 sufficient to permit movement of one or more of the components 17 and 18 from the rack 14. In one embodiment, one or more of the components 17 and 18 is configured to slidably mount to the rack 14 such that, when desired, the one or more components 17 and 18 can slide horizontally outward from the rack 14 toward the front portion of the housing 12. The one or more components 17 and 18 can thereby be slidably removed in a drawer-like manner from the rack 14, with or without removal from the rack 14, to permit inspection, repair and/or replacement of the components 17 and 18.

In one embodiment, one or more brush grommets 91 are disposed in the area 90 between the rack 14 and the partition 39 to permit horizontal movement or a sliding motion of the components 17 and 18 forward/backward along the rack 14, while serving as airblocking barriers to prevent air loss from the area 90. The one or more brush grommets 91 are further configured to prevent mixing of exhaust air circulating in the exhaust plenum 22 with cooling intake air contained in the first intake plenum 20. In another embodiment, one or more gaskets or brush grommets can be disposed between the rack 14 and the partition 39 along that portion of the partition 39 from which the covering or film 42 has been removed. The one or more gaskets or brush grommets can be disposed along a perimeter of an area of the partition 39 defined by removal of the covering or film 42. The one or more gaskets or brush grommets can be disposed and configured help to form a seal between the rack 14, the equipment 17 and 18 and the partition 39 such that air loss is prevented/minimized.

Figure 9:
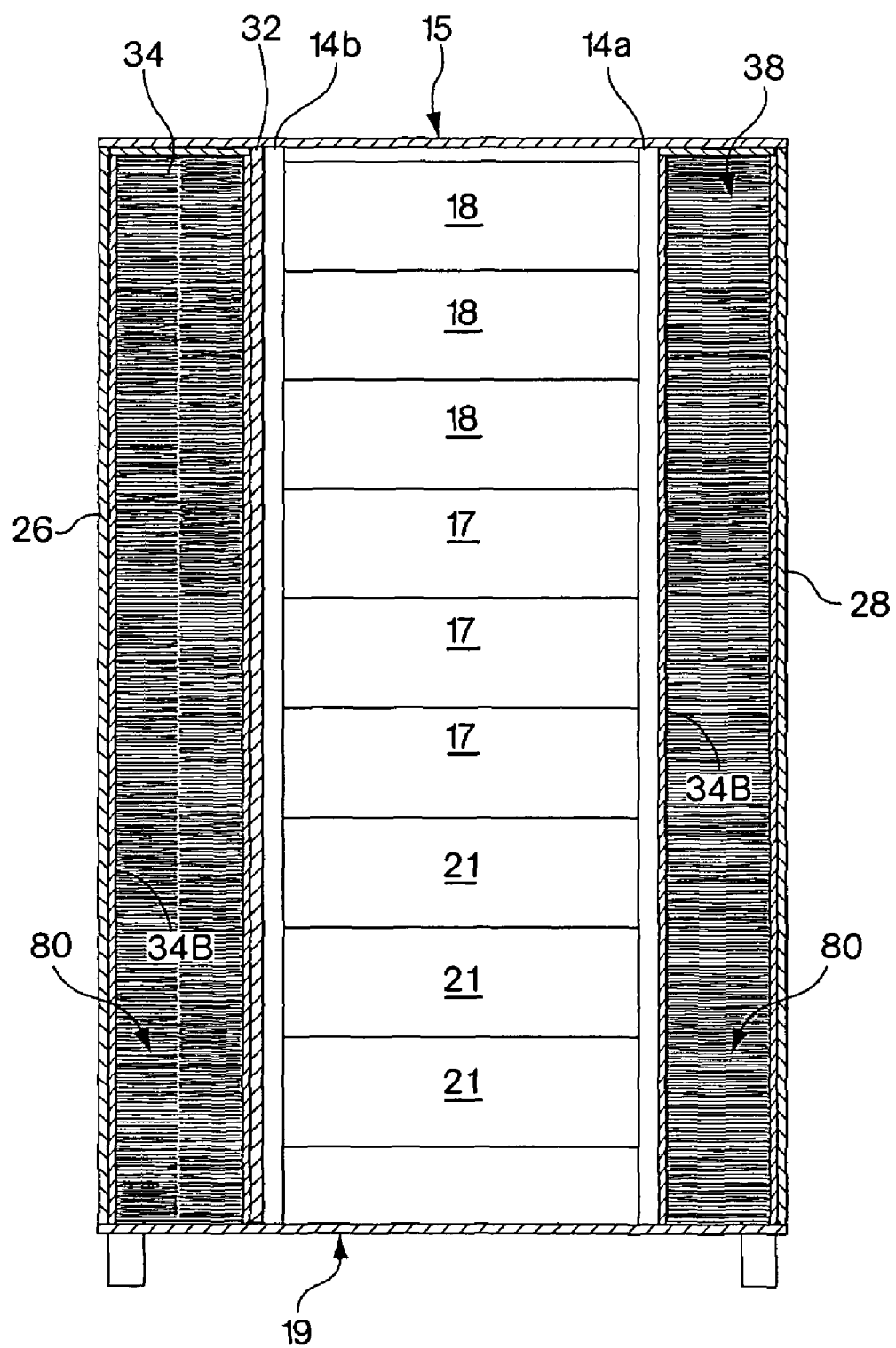
FIG. 9 is a front view of the enclosure shown in FIG. 1 with the front door removed illustrating another embodiment of one or more partitions according to the invention.

Referring to FIG. 9, in one embodiment, one or more of the partitions 32, 34, 35, 36 and 37 can be constructed and arranged as a gasket or brush grommet 80. In one embodiment, the gasket or brush grommet 80 can include the mounting frame 32b, 34b, 37b or 38b, as described above, such that the gasket or bros grommet 80 is disposed in the housing interior 13 in a desired position adjacent to the rack 14. The gasket or brush grommets or partitions 32, 34, 35, 36, 37 and 38 help to define the first intake plenum 20, the exhaust plenum 22 and the front intake plenum 23. The gasket or brush grommets or partitions 32, 34, 35, 36, 37 and 38 are constructed and arrange to permit one or more power or data cables and/or other connectors to be inserted into the gasket or brush portion 80A and threaded therethrough to route the cables and connectors through the rack 14 and along the left and/or the right side of the housing interior 13 to provide for cabling and power requirements. The gasket and brush grommets or partitions 32, 34, 35, 36, 37 and 38 are configured to permit cabling and to help to block/minimize airflow from the first and the front intake plenum 20 and 23 into the exhaust plenum 22, prevent/minimize circulation of exhaust air to intakes of the equipment components 17 and 18 and prevent/minimize mixing of cooling air with exhaust air.

Figure 10A:
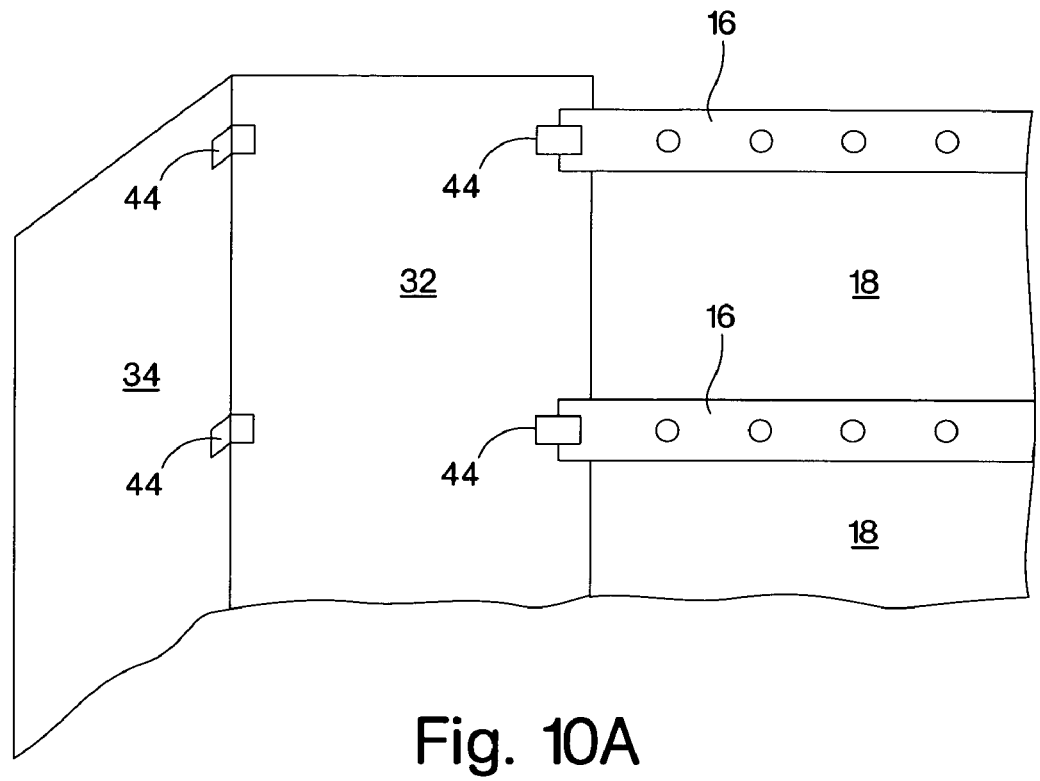
FIGS. 10A-10B are cut-away perspective views of portions of one or more partitions within the enclosure shown in FIG. 1 according to the invention.
Figure 10B:
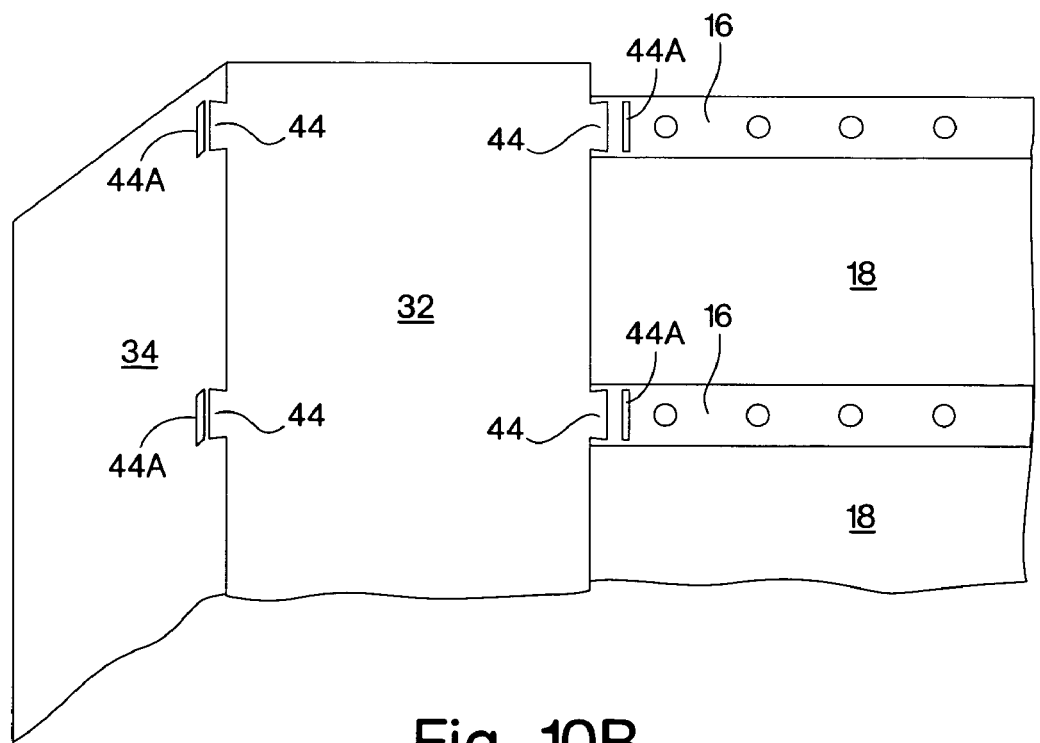

Referring to FIGS. 10A-10B, in one embodiment, one or more of the partitions 32, 34, 35, 36 and 38 can be removably joined or connected by one or more appropriate fasteners 44 to one or more of the members 16, the top panel 15, the bottom panel 19, the side panels 26 and 28 and the rear panel 24 to securely dispose the partitions 32, 34, 35, 36 and 38 in a desired position within the housing interior 13. Appropriate fasteners 44 are preferably constructed and arranged to permit quick connection to and removal from, e.g., the members 16, to enable the housing interior 13 to be easily configured in response to different types, sizes and U heights of the IT and telecommunications components 17 and 18, as well as to configure the interior 13 to accommodate airflow conditions and the distribution of the components 17 and 18 within the rack 14.

Preferred fasteners 44 can include, but are not limited to, screws, tabs, snap tabs, VELCRO® strips, and the like, which permit the partitions 32, 34, 36 and 38 to be readily removed and/or repositioned. An appropriate fastener 44 would depend on a material with which one or more of the partitions 32, 34, 36, and 38 is constructed as well as the size of the partition 32, 34, 36, and 38. For example, as show in FIG. 6A, in one embodiment, the partition 32 along the left side of the rack 14 can be removably connected to one or more of the members 16 by means of a metal snap or VELCRO® strip-like fastener 44, wherein an edge of the partition 32 butts an end or overlaps with the end of a member 16 and is connected thereto by the fastener 44. Similarly, the partition 32 can be removably connected to the adjacent partition 34 by similar means to help to define the first intake plenum 20.

As shown in FIG. 10A, in one embodiment, the partition 32 can be configured to include along a side edge one or more tabs 44 disposed and configured to be removably inserted into corresponding slots 44A defined in one or more of the members 16 to removably fasten or connect the partition 32 to the rack. The partition 32 can be further configured to include the tabs 44 on its opposite side to connect to the adjacent partition 34 to define the first intake plenum 20. In another embodiment, the partitions 32 and 34 can be formed from a single partition, wherein the single partition is constructed as a single plane and folded or bent to form the partitions 32 and 34 along the left side of the rack 14.

The partitions 32, 34, 35, 36, 37 and 38 can be constructed of a material suitable for use in an electronics environment. A material that is relatively lightweight to permit easy handling and portability, while sufficiently rigid to help to block/minimize airflow is suitable. A suitable material is relatively inexpensive such that in certain embodiments the partitions 32, 34, 35, 36, 37 and 38 can be economically constructed and, if desired, disposable. A material with which the partitions 32, 34, 35, 36, 37 and 38 can be constructed can be dependent upon the size and the position of the partitions 32, 34, 35, 36, 37 and 38 within the housing interior 13. In addition, a material of construction can be dependent on the extent and frequency with which the housing interior 13 will be reconfigured to accommodate the cooling and ventilating needs of the equipment 17 and 18. Such a material can include, but is not limited to, polypropylene or other thermoplastic plastics, aluminum sheeting, reinforced metal foil, reinforced plastic film, and combinations thereof.

The invention is not limited to the construction and arrangement of the partitions 32, 34, 35, 36, 37 and 38, and the blanking panels 21 as described above, and includes other barriers and/or partitions as well as other configurations and arrangements of the partitions 32, 34, 35, 36, 37 and 38 to help to define the first and/or the front intake plenums 20 and 22 and the exhaust plenum 23, as well as to help to configure or set up the housing interior 13 to facilitate front-to-back airflow and/or side-to-side airflow as needed. In particular, the invention includes various configurations and arrangements of barriers and/or partitions to accommodate the rack 14 containing exclusively IT or telecommunications components 17 and 18, or a mix of IT and telecommunications components 17 and 18 and to provide airflow to meet the cooling and ventilating requirements of each type of equipment 17 and 18.

Other features of the enclosure 10 according to the invention help to facilitate airflow within the housing interior 13 to achieve a front-to-back airflow configuration and/or a side-to-side airflow configuration. As noted above, the vented door 30 defines the multiple air vents 30A to permit air, e.g., ambient air, to flow into the front portion of the housing interior 13 and/or the air intake side 25 of the rack 14. In one embodiment, the door 30 can be sufficiently perforated, e.g., the multiple air vents 30A are concentrated along the left side of the door 30, to promote airflow into the first intake plenum 20. As shown in FIG. 3, in one embodiment, one or more gaskets 75, e.g., foam gaskets, can be disposed around perimeter edges of the equipment components 17 and 18 to help to provide a substantially airtight seal between the components 17 and 18 and the members 16 and between adjacent components 17 and 18 to help to prevent/minimize loss of cooling air from the first and front intake plenums 20 and 23.

Figure 11:
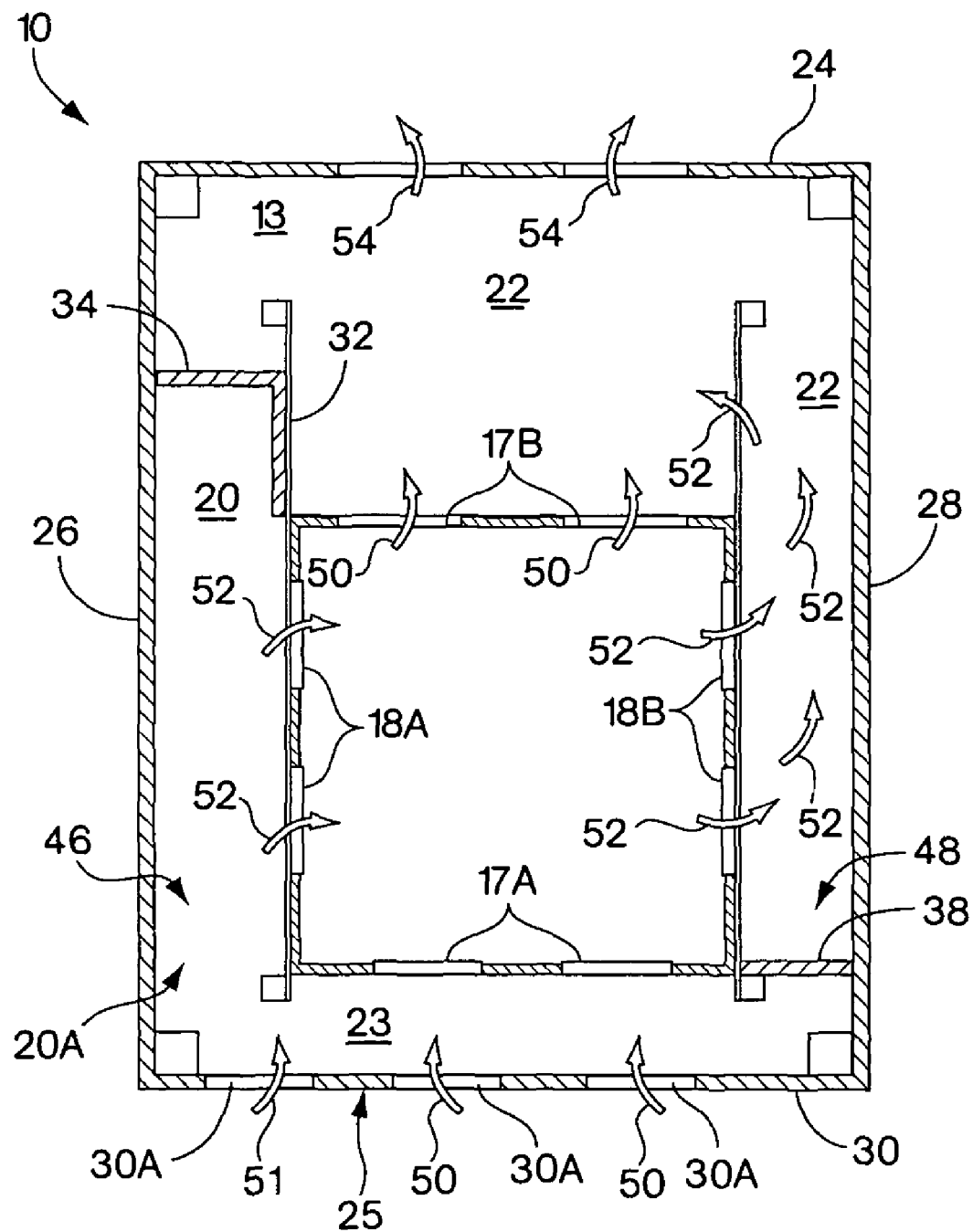
FIG. 11 is a top view cross section of the enclosure shown in FIG. 1 illustrating a first mode of airflow according to the invention.

Referring to FIG. 11, a top view cross-section of the enclosure 10 illustrates a first mode of airflow through the enclosure 10 that can be achieved where the front intake plenum 23 is in fluid communication with the first intake plenum 20. The first intake plenum 20 receives at least a portion of airflow directed and/or diverted laterally from the front intake plenum 23, as shown by arrow 51 in FIG. 11. To define a front-to-back airflow condition, cooling air is drawn from the vents 30A in the door 30 into the front intake plenum 23 by air intakes 17A disposed in front portions of the IT components 17. The air intakes 17A draw air into the front portions of the components 17. Drawn-in air flows from the front to back portions of the equipment 17 and is exhausted from back vents 17B disposed in the back portions of the components 17 in a front-to-back flow, as shown by arrows 50 in FIG. 11. To define a side-to-side airflow condition, cooling air is drawn from the door vents 30A and from the front intake plenum 23 by the air intakes 18A disposed in side portions of the telecommunications components 18, as shown by arrows 51 and 52 in FIG. 11. The air intakes 18A help to draw and/or to divert laterally into the first intake plenum 20 at least some portion of the front-to-back airflow, as well as help to draw cooling air directly from the door vents 30A. The intakes 18A along the side portions of the equipment 18 draw air from the plenum 20 into the components 18. Drawn-in air flows from one side to an opposite side of the components 18 and is vented from back vents 18A disposed along the opposite side of the components 18 in a side-to-side flow, as shown by arrows 52 in FIG. 11. Air vented from the IT and the telecommunications components 17 and 18 is exhausted from the exhaust plenum 22 to an area external to the housing 12, as shown by arrows 54 in FIG. 11.

Figure 12:
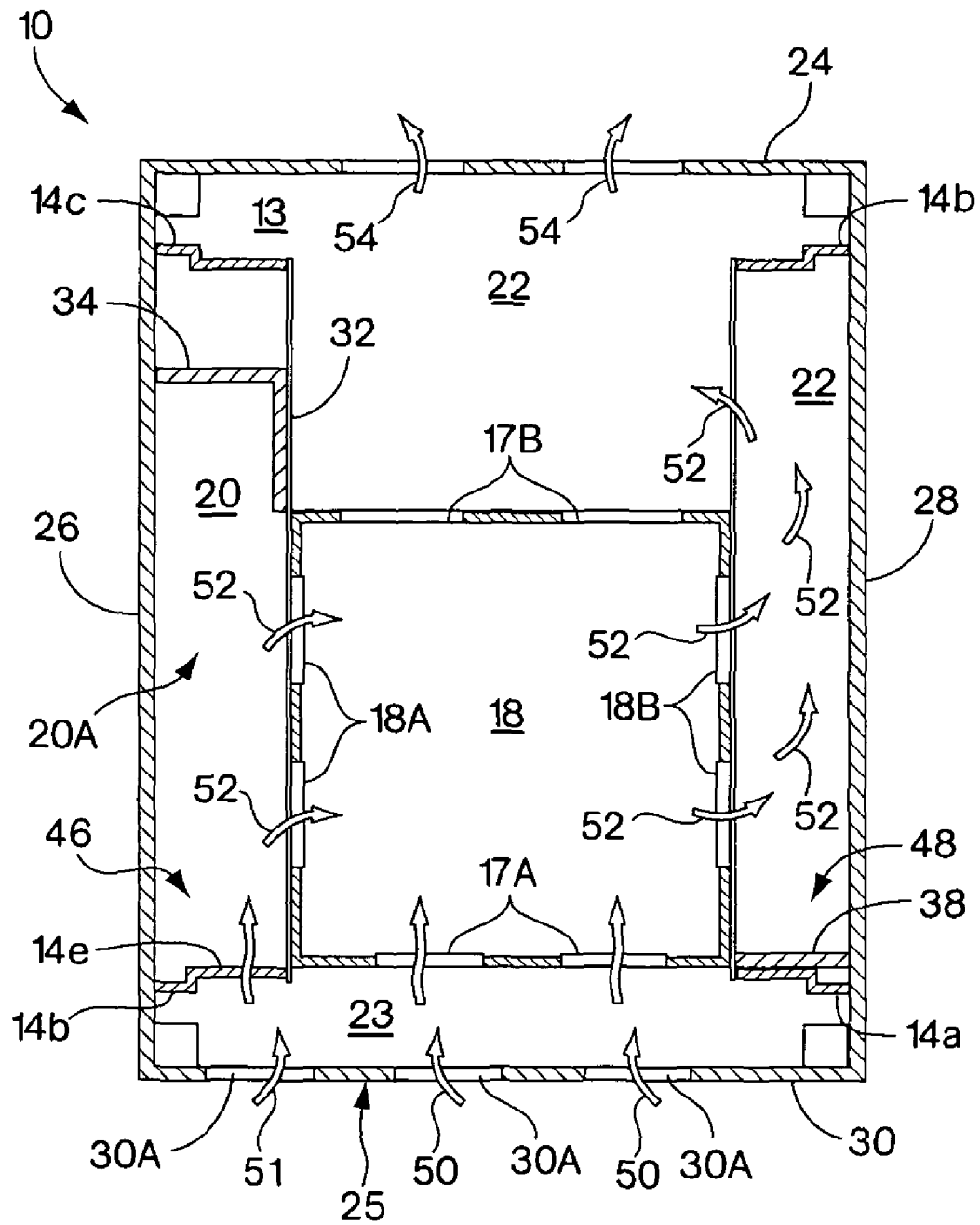
FIG. 12 is a top view cross section of the enclosure shown in FIG. 11 with the top panel removed illustrating one embodiment of the first mode of airflow.

Referring to FIG. 12, a top view cross section of the enclosure 10 illustrates embodiments of the enclosure 10 in which the rack 14 has a relatively wide width $W_1$, e.g., 23-inches, and is further configured such that the front vertical mounting rails 14a and 14b substantially fill an area at the front of the rack 14 between the rack 14 and each side panel 26 and 28, as shown. To facilitate the first mode of airflow through the enclosure 10, as described with reference to FIG. 11, the left vertical front mounting rail 14b can define multiple openings or vents 14e to permit air to flow into the first air intake plenum 20 from the air intake vents 30A of the door 30 and from the front portion of the housing interior 13 or the air intake side 25 of the rack 14, as shown by arrow 51 in FIG. 12. The multiple vents or openings 14e help to provide air to the first air intake plenum 30 to thereby help to provide sufficient side-to-side airflow used by, for example, the telecommunications equipment 18, for cooling, as shown by arrows 52 in FIG. 12. In one embodiment, the left vertical mounting rail 14b has the multiple vents or openings 14e defined along at least a portion of the height $H_1$ of the rack 14. In another embodiment, the left vertical mounting rail 14b has the multiple vents or openings 14e defined along a portion of the height $H_1$ of the rack 14 to the extent that the equipment components 18 using side-to-side airflow are mounted and distributed in the rack 14.

Figure 13:
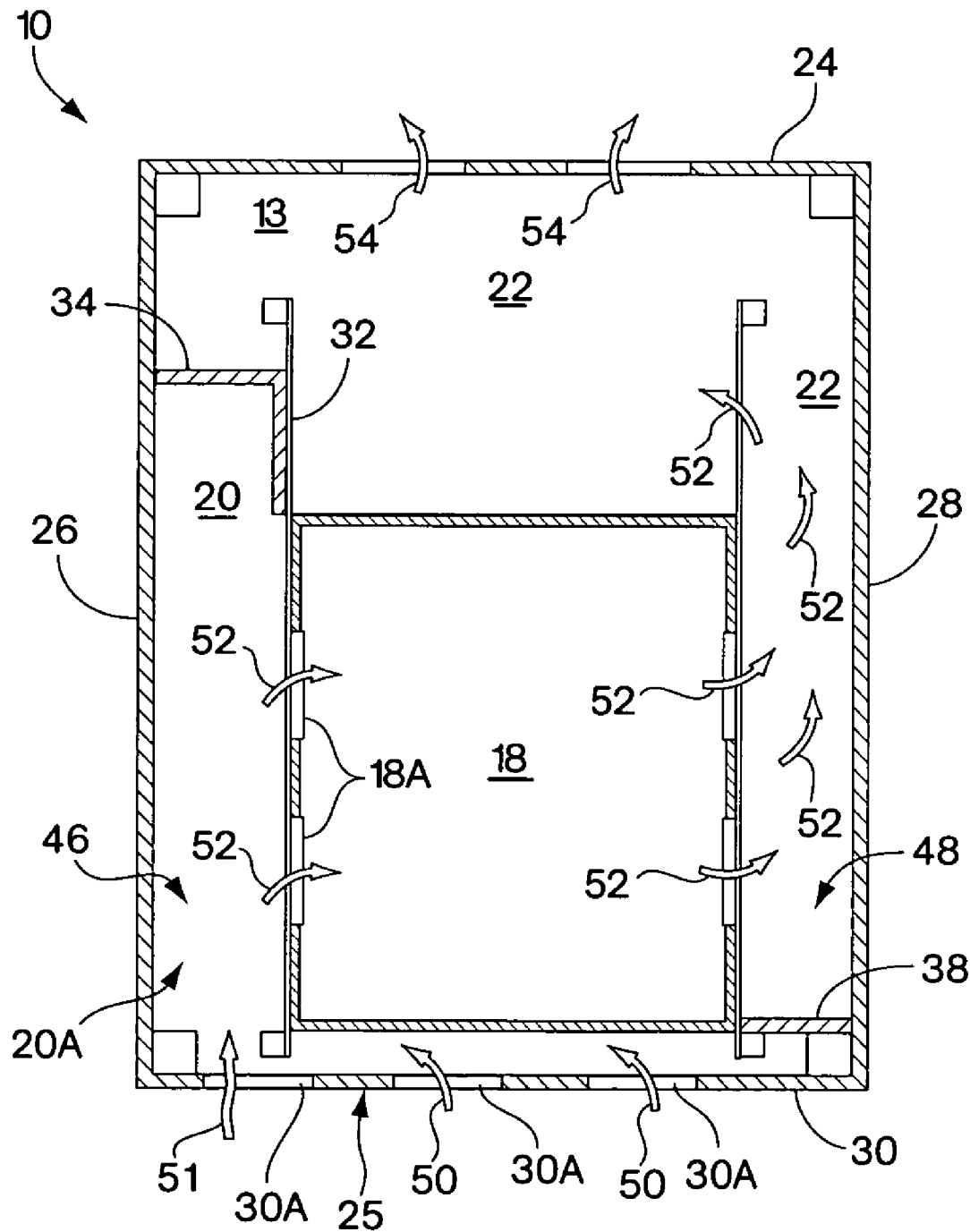
FIG. 13 is a top view cross section of the enclosure shown in FIG. 1 with the top panel removed illustrating a second mode of airflow according to the invention.

Referring to FIG. 13, a top view cross-section of the enclosure 10 illustrates a second mode of airflow through the enclosure 10 that can be achieved wherein the rack 14 is positioned at the front of the housing 12 such that the rack 14 and the partition 38 help to define the exhaust plenum 22 only. In this embodiment, the front intake plenum 23 is not defined in the housing interior 13 and the partition 38 is disposed behind the door 30. The housing interior 13 can accommodate the rack 14 loaded exclusively with the telecommunications components 18. Cooling air is drawn through the air vents 30A in the door 30 and flows directly into the plenum 20, as shown by arrows 50 and 51 in FIG. 13.

Figure 14A:
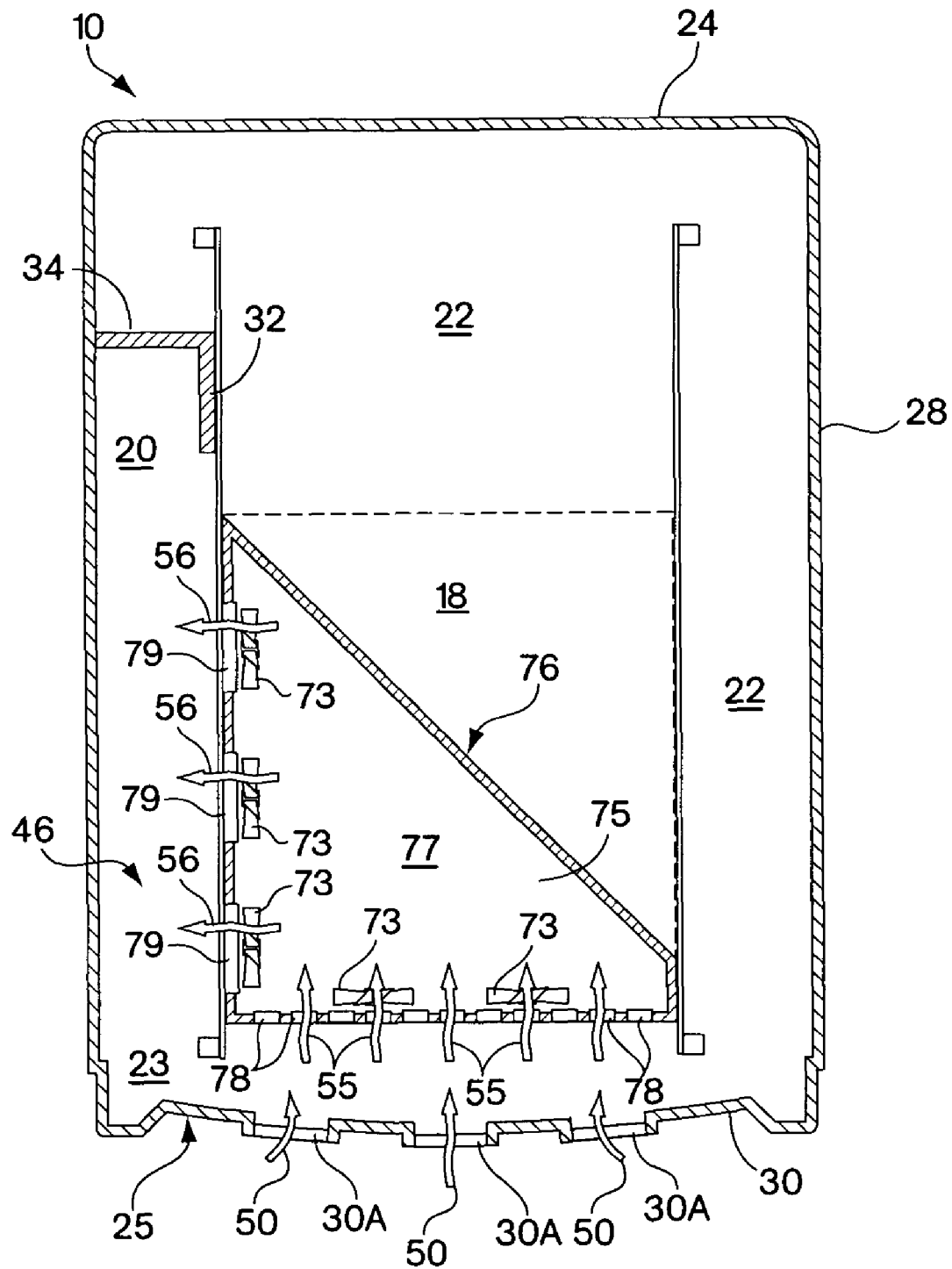
FIG. 14A is a top view cross section of the enclosure shown in FIG. 1 with the top panel removed illustrating a third mode of airflow according to the invention.
Figure 14B:
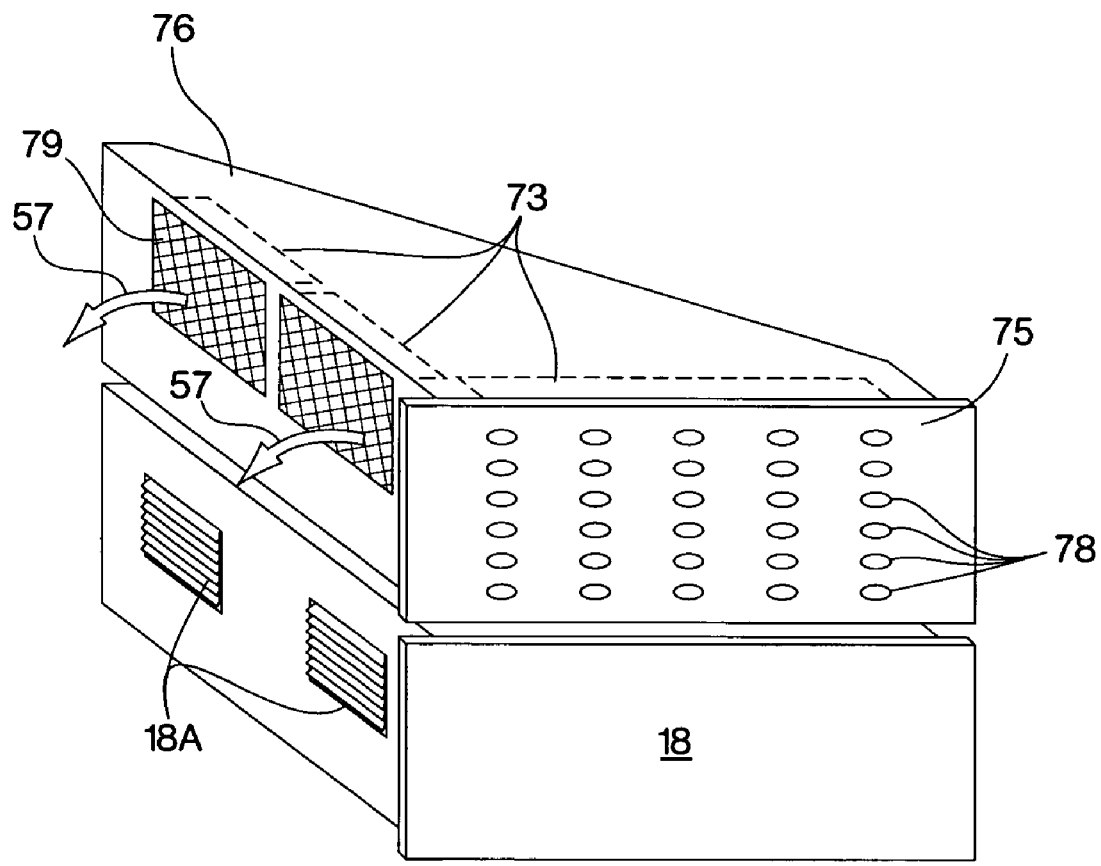
FIG. 14B is a perspective view of a duct unit and an electronic component that uses side-to-side airflow for cooling and ventilating.

Referring to FIGS. 14A-14B, in other embodiments of the enclosure 10 according to the invention, the enclosure 10 can include one or more duct units 75 configured and sized for vertical mounting in the rack 14. As shown in a top view cross section of the enclosure 10 in FIG. 14A, the duct unit 75 can have overall dimensions to permit rack mounting within the equipment area of the rack 14. The duct unit 75 includes a housing 76 defining an internal chamber or duct 77 that is configured to receive and to contain air. The duct unit 75 further includes multiple front vents or openings 78 defined in its front side and multiple side vents or openings 79 defined in its left side when rack-mounted. The chamber 77 of the duct unit 75 can be defined with overall dimensions such that it receives air from the multiple front openings 78 and helps to direct air through the duct unit 75 to the multiple side openings 79 to thereby provide air to the first intake plenum 20. As shown in FIG. 14A, in one embodiment, the housing 76 of the duct unit 75 can be constructed and arranged such that the housing defines the chamber 77 with a configuration or shape, e.g., a funnel-like shape as shown in FIG. 14A, that helps to direct or channel air from the multiple front openings 78 to the multiple side openings 79 and thereby helps to increase volume or rate of airflow into the first intake plenum 20.

The duct unit 75 is disposed in the rack 14 and the chamber 77 is configured such that the chamber 77 receives and thereby captures at least some portion of front-to-back airflow from the front intake plenum 20 in the front portion of the housing interior 13 or from the air intake side 25 of the rack 14, as shown by arrows 55 in FIG. 14A. As equipment components using front-to-back airflow draw air from the front vents 30A of the door 30 into the front intake plenum 23 to configure front-to-back airflow conditions, as described above with reference to FIGS. 11-12 and as shown by the arrows 50 in FIG. 14A, the duct unit 75 helps to divert some portion of the front-to-back airflow to the first intake plenum 20 along the left side of the rack 14, as shown by arrows 56 in FIG. 14A, to provide for side-to-side airflow.

Referring further to FIGS. 14A-14B, in one embodiment, the duct unit 75 can include one or more fans 73 disposed within the chamber 77. In one embodiment, one or more fans 73 can be coupled to the multiple front openings 78 where each fan 73 is disposed and configured to draw in cooling air from the front intake plenum 20 in the front portion of the housing interior 13 or from the air intake side 25 of the rack 14 into the chamber 77, as shown by the arrows 55 in FIG. 14A. The fans 73 are further configured to force drawn-in air into the chamber 77 and through the multiple side openings 79 into the first air intake plenum 20, as shown by the arrows 56 in FIG. 14B. In another embodiment, one or more fans 73 can be coupled to the multiple side openings 78 where each fan is disposed and configured to draw cooling air through the chamber 77 and from the front intake plenum or the air intake side 25 of the rack 14. The fans are further configured to force drawn-in air into the first intake plenum 20. In another embodiment, the duct unit 75 can include one or more fans 73 coupled to the multiple front and the side openings 78 and 79.

Figure 14C:
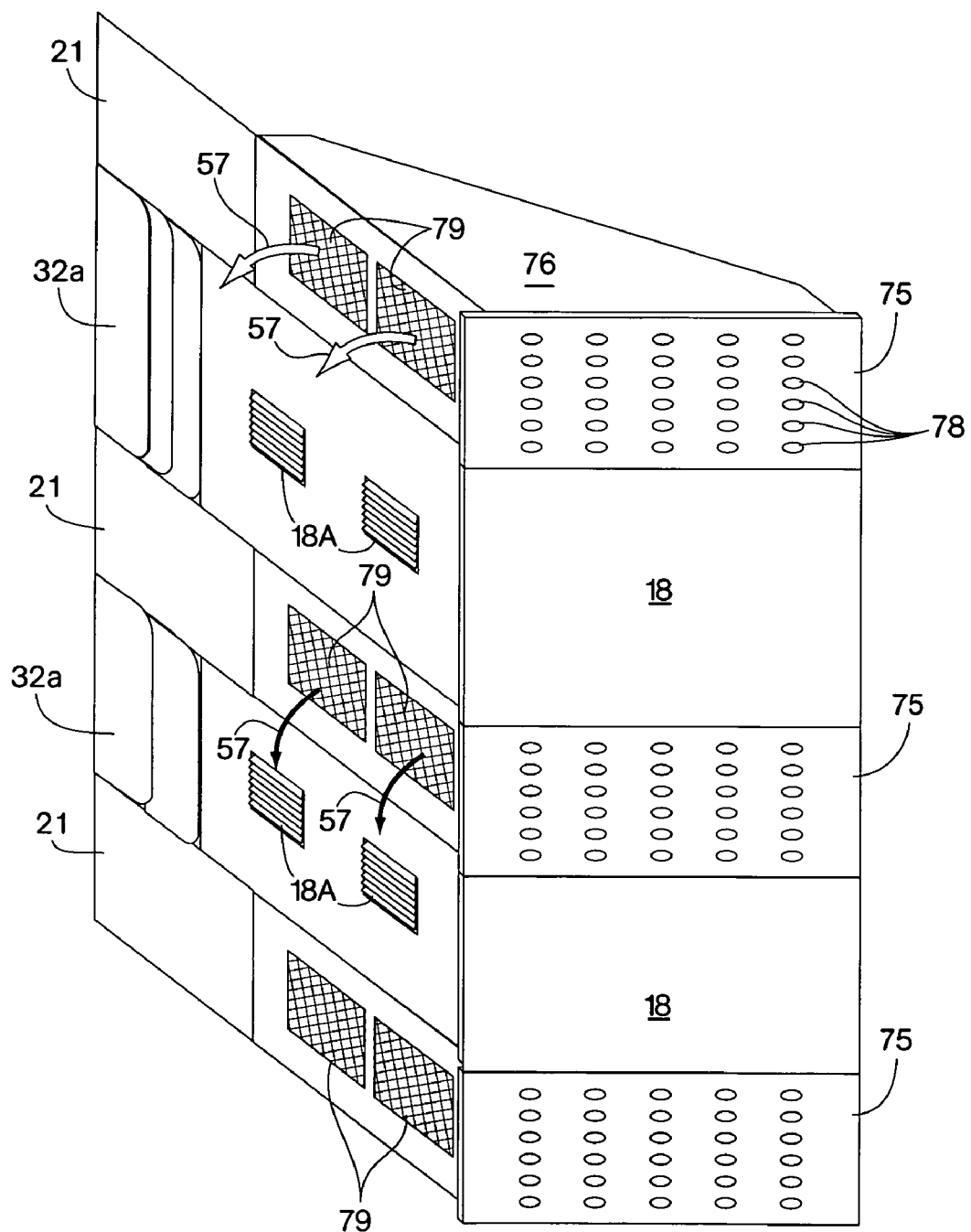
FIG. 14C is a perspective view of duct units in relation to electronic components that use side-to-side airflow.

Referring to FIG. 14C, and with further reference to FIG. 14B, in one embodiment, the housing 77 of the duct unit 75 can be constructed and arranged to define a certain U height and a certain depth to permit the duct unit 75 to be mounted vertically adjacent to and/or between the equipment components 17 and 18 disposed in the equipment area of the rack 14. The duct unit 75 can be mounted in the rack 14 at a desired position selected to correspond to the location and distribution of equipment using side-to-side airflow, such as the telecommunications components 18. As shown in FIG. 14C, the duct unit 75 can be mounted in the rack 14 adjacent, e.g. above or below, and/or between the equipment components 18 using side-by-side airflow. As shown in FIGS. 14B-14C, when mounted adjacent to or between the equipment components 18 using side-to-side airflow, the duct unit 75 can direct chamber air, e.g., drawn into the chamber 77 by the air intakes 18A of the components 18 and/or forced or drawn into the chamber 77 by the fans 73 coupled to the multiple front and/or side openings 78 and 79, through its multiple side openings 79 into the first intake plenum 20. The duct unit 75 thereby vents cooling air proximate to the side vents 18A of the components 18, as shown by arrows 57 in FIGS. 14B-14C. The side vents 18A can draw air from the multiple side openings 79 of the duct unit 75 to thereby help to draw sufficient intake air for cooling in a side-to-side condition.

Figure 15A:
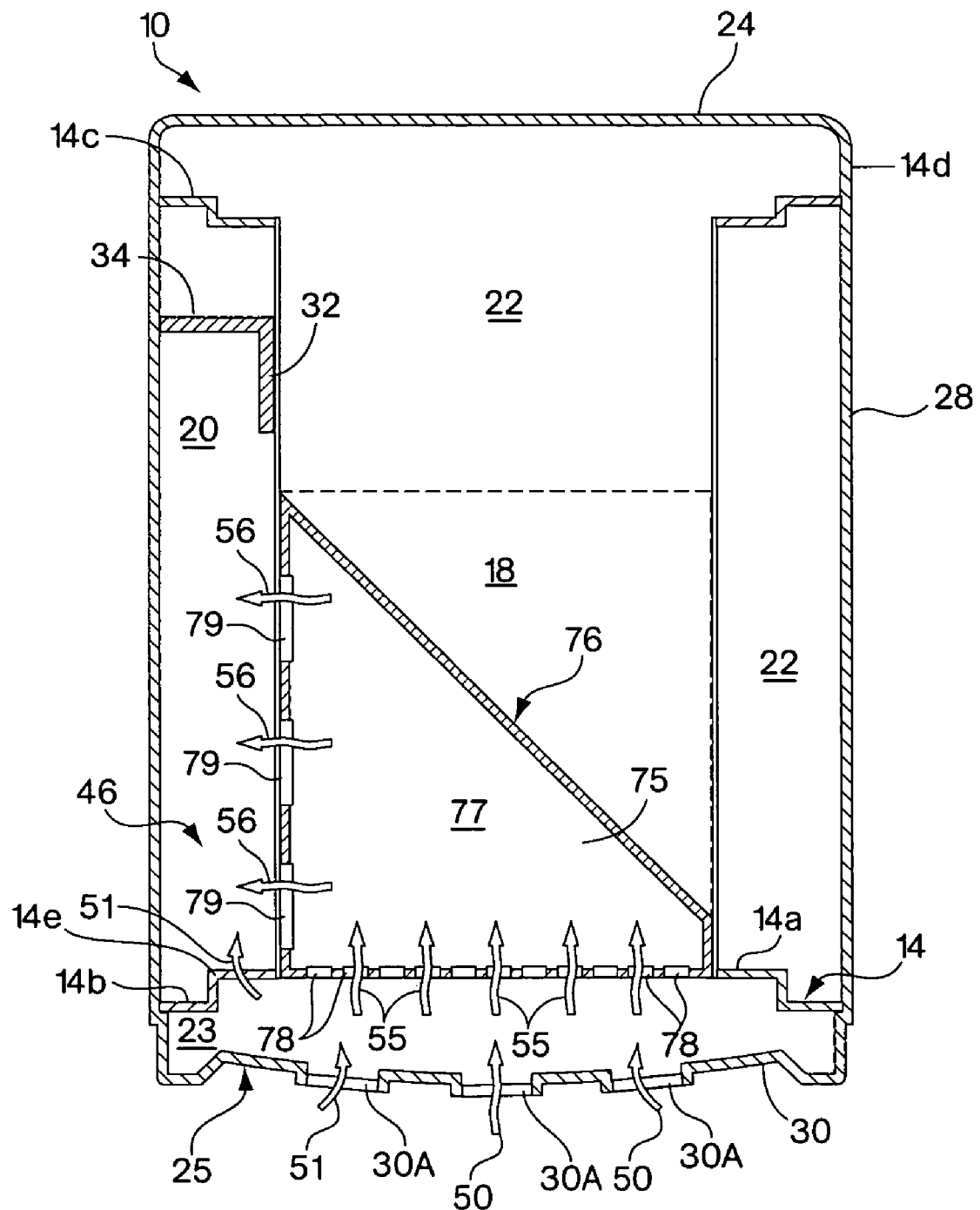
FIG. 15A is a top view cross section of the enclosure of FIG. 1 with the top panel removed illustrating one embodiment of the enclosure interior to permit airflow illustrated in FIG. 14A.

Referring to FIG. 15A, a top view cross section of the enclosure 10 illustrates one embodiment of the enclosure 10 illustrated in FIGS. 14A-14C in which the rack 14 has a relatively wide width $W_1$, e.g., 23-inches, and is further configured such that the front vertical mounting rails 14a and 14b substantially fill an area at the front of the rack 14 between the rack 14 and each side panel 26 and 28. The left vertical front mounting rail 14b can define the multiple vents 14e to permit air to flow into the first air intake plenum 20 from the air intake vents 30A of the door 30 and from the front portion of the housing interior 13 or the air intake side 25 of the rack 14, as shown by the arrow 51 in FIG. 15A and as described with reference to FIGS. 11-12.

Figure 15B:
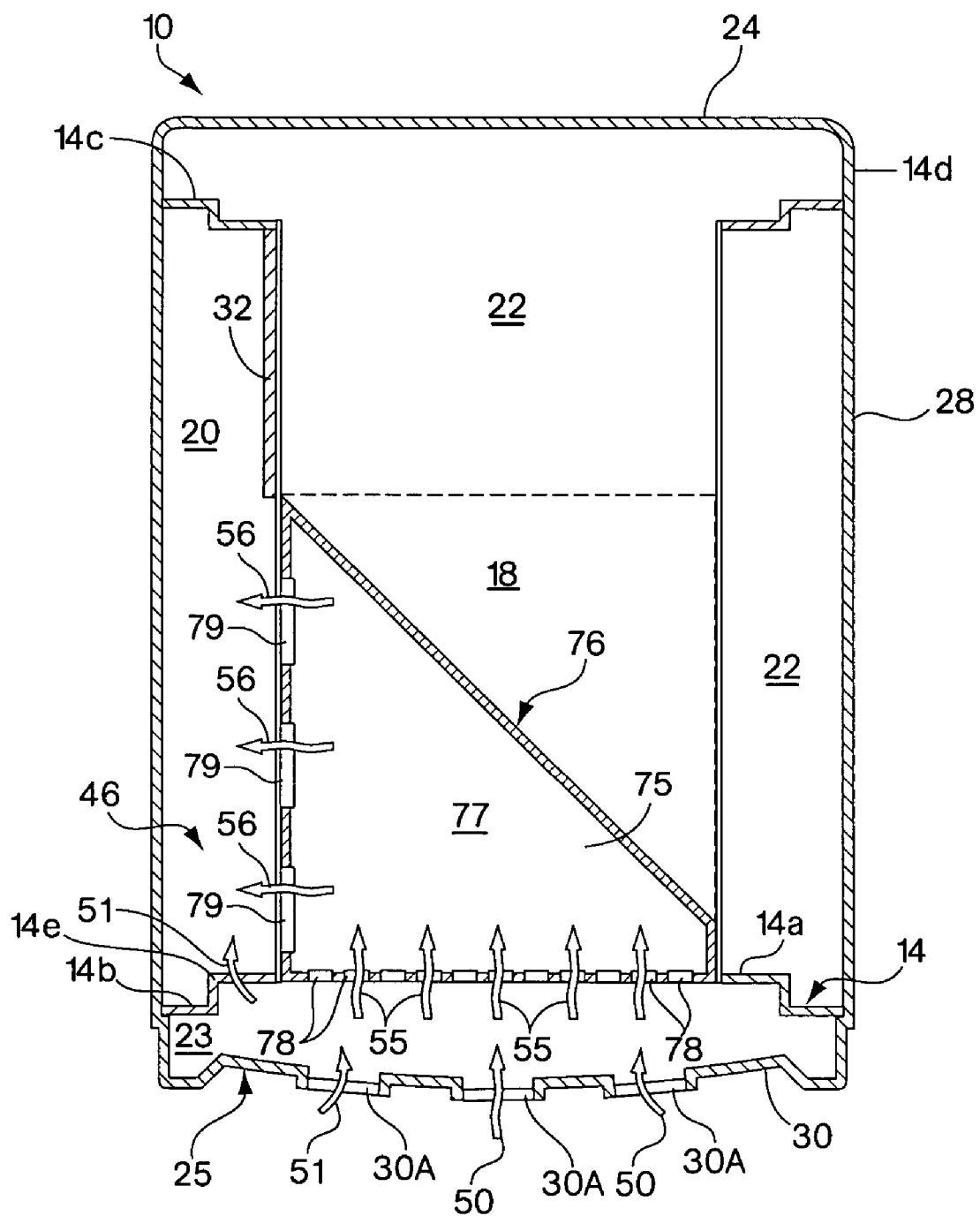
FIG. 15B is a top view cross section of the enclosure of FIG. 1 with the top panel removed illustrating another embodiment of the enclosure interior to permit airflow illustrated in FIG. 14A.

Referring to FIG. 15B, is another embodiment of the enclosure 10 shown in FIG. 15A, the partition 32 can extend from the equipment 17 and 18 to the left back mounting rail 14c to help to define the first intake plenum 20. In different embodiments, the partition 32 can include various configurations and arrangements are described above with reference to FIGS. 6A-6B, 7A-7B and/or 8A-8C.

Figure 16:
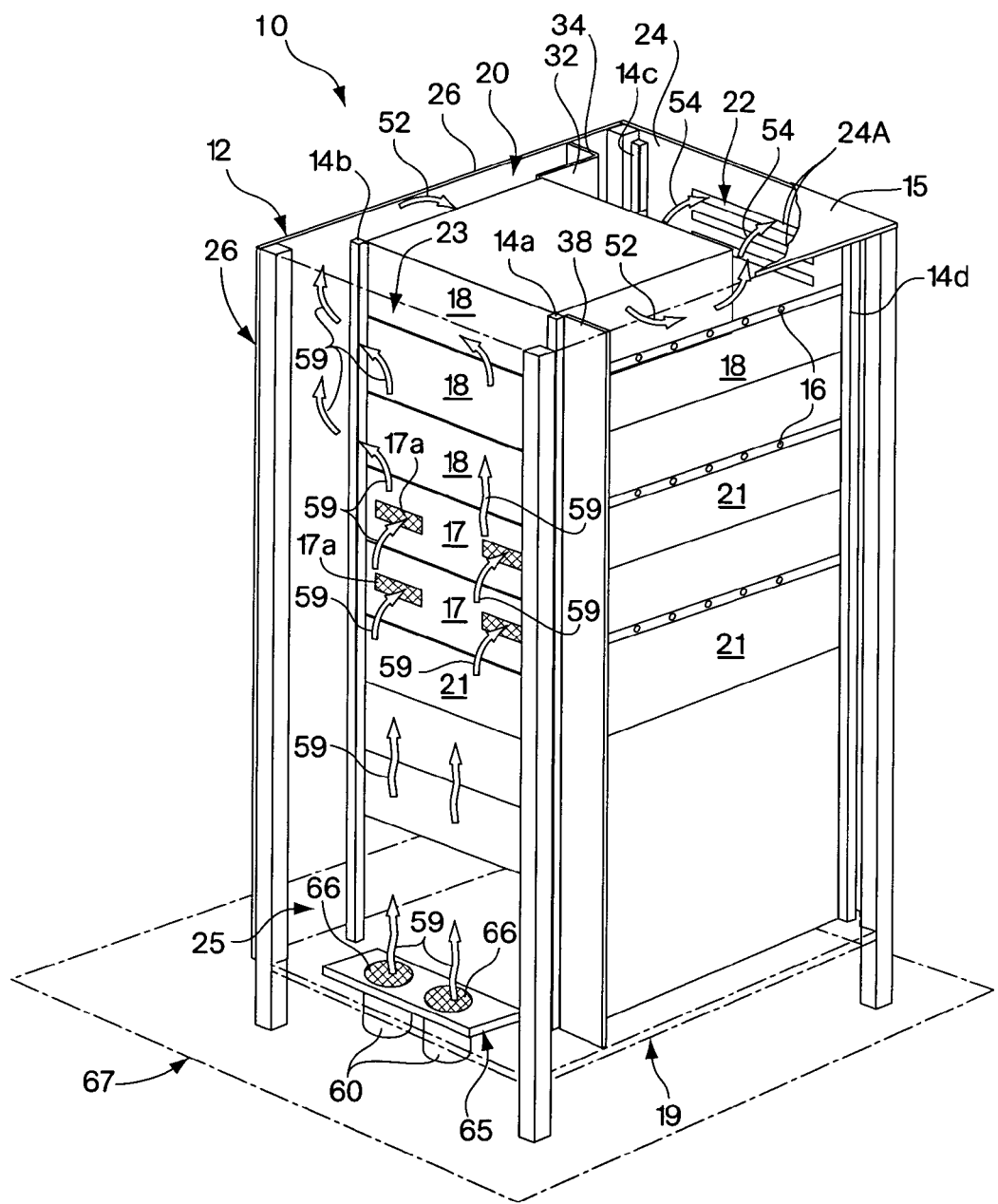
FIG. 16 is a perspective view of the enclosure shown in FIG. 1 with the front door, the side panel and the top panel removed and including an air distribution unit mounted therein.

Referring to a perspective view of the enclosure 10 in FIG. 16, a third mode of airflow through the enclosure 10 can be achieved where the front intake plenum 23 is in fluid communication with one or more openings in the bottom panel 19 of the housing 12. The one or more openings can serve to provide cooling air into the housing interior 13 such that the cooling air flows into the front intake plenum 23 and circulates upward vertically along the front portion of the housing interior 13 or along the air intake side 25 of the rack 14. As shown in FIG. 16, in one embodiment, each of the one or more openings in the bottom panel 19 is coupled to a plenum or duct 60 that extends externally from the bottom panel 19 and connects with a conventional raised floor configuration 67. The raised floor configuration 67 is well known in the art and can include a first floor and a second floor that define a conduit therebetween, wherein the conduit is connected to an air cooling unit or system that supplies cool air to the conduit. The conduit receives cool air from the cooling unit or system and directs the cool air into the one or more ducts 60 to supply cooling air to the housing interior 13.

Still referring to FIG. 16, in another embodiment, the one or more ducts 60 can be coupled to a rack-mounted air distribution unit 65, as disclosed in the applicants' copending patent application Ser. No. 10/121,313, which is incorporated herein by reference. The air distribution unit 65 is disposed along and/or coupled to the bottom panel 19 within the housing interior 13 and coupled to the raised floor configuration 67 through the one or more ducts 60 to receive and/or to draw in cool air. Multiple fans 66 of the unit 65 can draw cooling air from the ducts 60 into the front intake plenum 23 and can circulate cooling air upward along the front portion of the housing interior 13 or along the air intake side 25 of the rack 14 to configure a bottom-to-top airflow, as shown by arrows

59 in FIG. 16. In another embodiment, multiple fans are not connected to the ducts 60 and are configured to draw in ambient air external to the enclosure 10 into the system 65 for distribution upward as cooling air in bottom-to-top airflow condition, as described.

As shown in FIG. 16, the enclosure 10 is configured such that cooling air can be received by the first intake and the front intake plenums 20 and 23 from the unit 65, as described above and shown by arrows 59 in FIG. 16. In this case, a bottom-to-top airflow condition is defined as cooling air is forced and/or drawn upward through the front intake plenum 23 along the front portions of the IT components 17. The bottom-to-top airflow helps to contribute to a front-to-back airflow condition and a side-to-side airflow condition, for instance, by increasing the volume of the cooling air forced upward through the front intake plenum 23 and received by the first intake plenum 20. In addition, the air distribution unit 65 forces the bottom-to-top airflow into the first and the front intake plenums 20 and 23 such that the plenums 20 and 23 become pressurized due to an increased volume and rate of cooling air flowing into the plenums 20 and 23 from the ducts 60 and the unit 65.

Figure 17:
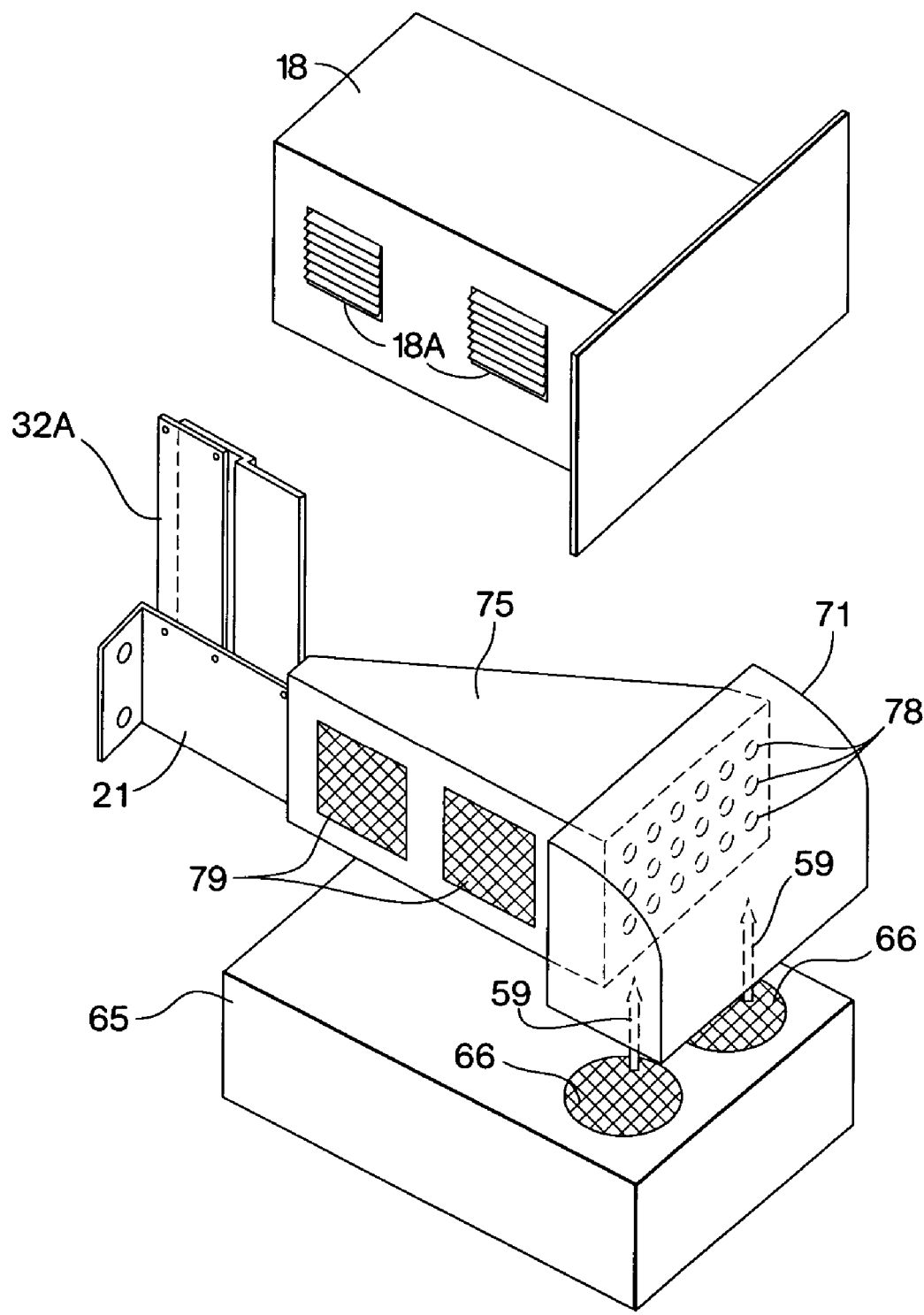
FIG. 17 is an exploded perspective view of the air distribution system shown in FIG. 16 and the duct unit shown in FIG. 14A-14C.

Referring to FIG. 17, in one embodiment, the enclosure 10 can include the air distribution unit 65, as described above, and can be further configured to rack-mount one or more of the duct units 75. As shown in an exploded perspective view of FIG. 17, the multiple fans 66 of the air distribution unit 65 can draw in cooling air and force drawn-in air into the front intake plenum 23 at the front portion of the housing interior 13 or the front intake 25 of the rack 14 and upward in a bottom-to-top airflow condition, as shown by the arrows 59 in FIG. 16. The multiple front openings 78 of one or more of the duct units 75 can receive or capture some portion of bottom-to-top airflow provided by the air distribution unit 75. In one embodiment, one or more of the duct units 75 includes one or more fans 73 disposed within the chamber 77, as described above, to drawn in the bottom-to-top airflow the air distribution system 65 creates by forcing cooling air into the front intake plenum 23 in the front portion of the enclosure interior 13. The unit 65 and the fans 73 of the duct units 75 help to increase the volume and/or rate of flow of cooling air into the first intake plenum 20 and thereby help to pressurize the first intake plenum 20. The first intake plenum 20 receives and contains cooling air under pressure, which helps to insure that the air intakes 18A of the side-to-side airflow components 18 have sufficient air from which to draw to meet its cooling needs.

In one embodiment, one or more of the duct units 75 further includes a hood-like member 71 that is configured to couple with a front portion of the duct unit 75 and is further configured to be disposed in the front intake plenum 23 or the front portion of the housing interior 13. The hood-like member 71 is disposed within the housing interior 13 and configured to capture some portion of cooling air forced upward in bottom-to top airflow to help to provide sufficient cooling air to the first intake plenum 20 via the duct unit 75.

Other embodiments are within the scope and spirit of the appended claims. For example, the first intake plenum 20 can be disposed and configured on the right side of the rack 14. The partitions 32 and 34 can be disposed in the space 48 between the right side panel 28 of the housing 12 and the rack members 16 running front-to-back along the right side of the rack 14.

Another example includes embodiments wherein the vented rear panel 24 of the housing 12 can be configured to couple to an exhaust unit disposed externally along the rear of the enclosure 10 and having one or more fans for drawing and venting exhaust air, as disclosed in the applicants' copending U.S. application Ser. No. 10/303,641, which is incorporated herein by reference. In one embodiment, the external exhaust unit can replace the vented rear panel 24 and can be configured to serve as a back door of the housing 12. Each fan of the exhaust unit is coupled to an exhaust duct defined within the exhaust unit interior. The exhaust duct is configured to receive air the fan draws in and vents into the exhaust duct and to direct fan-vented air to a top portion of the exhaust unit for venting to an area external to the enclosure 10. Each fan is disposed in fluid communication with the exhaust plenum 23 and the equipment vents 17A and 18A of the components 17 and 18. Each fan draws in hot and warm exhaust air from the exhaust plenum 23 into the exhaust unit, and then vents drawn-in air into its associated duct. Fan-vented air is thereafter directed by the exhaust duct to the top of the exhaust unit for venting.

In another embodiment, the exhaust unit having one or more fans as described is disposed at a top of the enclosure 10. Each fan draws air from the exhaust plenum 23 and vents drawn-in air to an area external to the enclosure 10.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An enclosure for containing electronic equipment that produces heat during operation, the enclosure comprising:
   a housing including a front panel and a back panel opposite to the front panel, a first side panel defining a side of the housing and a second side panel opposite to the first side panel defining an opposite side of the housing, and a top panel and a bottom panel opposite to the top panel, the housing defining an interior chamber;
   the housing further defining at least one air opening defined along the front panel to intake cooling air external to the enclosure;
   the housing further defining a front air intake plenum defined between the front panel and one or more equipment components mounted within the interior chamber, the front air intake plenum being disposed in direct fluid communication with the at least one air intake opening;
   the housing further defining a first side air plenum defined between one of the first side panel and the second side panel and one or more equipment components contained within the interior chamber, the first side air plenum being disposed in direct fluid communication with the front air intake plenum, the first side air intake plenum having a plurality of openings formed therein in communication with air inlets of one or more equipment components contained within the interior chamber to deliver cooling air from the first side air plenum to the one or more equipment components; and
   a second side air plenum defined between the other of the first side panel and the second side panel and one or more equipment components contained within the interior chamber, the second side air plenum having a plurality of openings formed therein in communication with air outlets of the one or more equipment components to exhaust fluid from the one or more equipment components to the second side air plenum; and, a rear air plenum in fluid communication with at least the second side air plenum for receiving said fluid from the second side air plenum, wherein the first and second side air plenums cooperate to promote fluid flow across the one or more equipment components to achieve cooling by side-to-side airflow and wherein the cooling air received through the first air intake plenum is exhausted through the rear plenum.

2. The enclosure of claim 1, wherein the first side air plenum is further defined by one or more airflow blocking partitions disposed within the interior chamber between one of the first side panel and the second side panel and one or more equipment components, and between the top panel and the bottom panel.

3. The enclosure of claim 2, wherein the one or more airflow blocking partitions collectively extend between the top panel and the bottom panel to form a barrier to prevent mixing of air contained within the first side air plenum with air contained along an exhaust side of the enclosure defined between the back panel and one or more equipment components contained within the interior chamber.

4. The enclosure of claim 2, wherein the one or more airflow blocking partitions are configured to removably connect to at least one of the first side panel and the second side panel, and at least one of the top panel, the bottom panel, another airflow blocking partition and an equipment component contained in the interior chamber.

5. The enclosure of claim 1, wherein the front air intake plenum is disposed and configured to permit at least a portion of air contained within the front air intake plenum to flow into the side air intake plenum.

6. The enclosure of claim 1, wherein the front intake air plenum is disposed opposite to an exhaust side of the enclosure defined between the back panel and one or more equipment components contained within the interior chamber, wherein the exhaust side is configured to receive exhaust air vented from any of the one or more equipment components achieving cooling by front-to-back airflow.

7. The enclosure of claim 6, wherein the housing further defines at least one air exhaust opening defined along at least one of the back panel and the top panel.

8. The enclosure of claim 1, wherein the second side air intake plenum is configured to receive exhaust air vented from any of the one or more equipment components achieving cooling by side-to-side airflow.

9. The enclosure of claim 8, wherein the second side air plenum is in fluid communication with an exhaust side of the enclosure defined between the back panel and one or more equipment components contained within the interior chamber.

10. The enclosure of claim 8, wherein the housing further defines at least one air exhaust opening defined along at least one of the back panel and the top panel.

11. The enclosure of claim 1, further comprising one or more blanking panels disposed at locations along at least one of: (i) above, (ii) below and (iii) between one or more equipment components, the one or more blanking panels being disposed and configured to prevent flow of received air from the side air intake plenum into one or more other portions of the interior chamber.

12. The enclosure of claim 1, wherein the first side air plenum is disposed at a substantially perpendicular orientation relative to the front air intake plenum.

13. The enclosure of claim 3, wherein the rear air plenum is defined within the interior chamber between the back panel and one or more equipment components contained within the interior chamber, the back air exhaust area disposed at the exhaust side and opposite to the front air intake area.

14. A method of cooling electronic equipment components within an enclosure, the method comprising:
mounting electronic equipment components at a front of the enclosure;
receiving air in a front air intake area of the enclosure via intake openings in a front panel of the enclosure;
circulating at least a portion of the received air from the front air intake area directly to a side air intake area;
delivering air from the side air intake area directly to one or more electronic equipment components via openings in the side air intake area in communication with inlets of the one or more electronic equipment components; and
receiving exhaust air vented from outlets of any of the one or more electronic equipment components achieving cooling by side-to-side airflow through the one or more electronic equipment components via openings in a side exhaust intake area located opposite to the side air intake area, receiving exhaust air vented from the exhaust intake area in a rear exhaust plenum.

15. The method of claim 14, further comprising receiving exhaust air vented from any of one or more electronic components achieving cooling by front-to-back airflow along a back exhaust area located opposite to the front air intake area.

16. The method of claim 14, further comprising preventing mixing of air contained within the side air intake area with air contained within the back exhaust area.

17. The method of claim 14, further comprising containing air in at least one of the front air intake area and a first side plenum.

18. The method of claim 15, further comprising circulating exhaust air between the second side plenum and the back exhaust area.

19. The enclosure of claim 1, wherein the plurality of openings are formed along a length of each of the first and second side air intake plenums.

20. The enclosure of claim 1, wherein at least one of the first side air intake plenum and second side air intake plenum extends from the bottom panel to the top panel and has a uniform depth in a direction from the front panel to the back panel.

21. The enclosure of claim 6, wherein the front air intake plenum is in fluid communication with air inlets of at least one equipment component achieving cooling by front-to-back airflow, and wherein the second side air plenum is in fluid communication with the air outlets of the at least one equipment component achieving cooling of the at least one equipment component by front-to-back airflow.

22. The enclosure of claim 1, wherein the housing further comprises mounting rails at a front of the enclosure to facilitate mounting equipment components within the interior chamber.

* * * * *